United States Patent [19]

Kobayashi et al.

[11] Patent Number: 5,793,047
[45] Date of Patent: Aug. 11, 1998

[54] PHOTOELECTRIC CONVERSION APPARATUS AND X-RAY IMAGE PICKUP APPARATUS

[75] Inventors: Isao Kobayashi; Akira Funakoshi, both of Atsugi; Akira Tago, Utsunomiya; Noriyuki Kaifu, Hachioji; Shinichi Takeda, Atsugi; Eiichi Takami, Chigasaki; Masakazu Morishita, Hiratsuka; Shinichi Hayashi, Ebina; Chiori Mochizuki, Zama; Tadao Endo, Atsugi; Toshikazu Tamura, Utsunomiya; Kazuaki Tashiro, Hadano, all of Japan

[73] Assignee: Canon Kabushiki Kaisha, Tokyo, Japan

[21] Appl. No.: 710,948

[22] Filed: Sep. 24, 1996

[30] Foreign Application Priority Data

Sep. 28, 1995 [JP] Japan ................... 7-250511
Jan. 8, 1996 [JP] Japan ................... 8-000582
Mar. 5, 1996 [JP] Japan ................... 8-047417
Sep. 19, 1996 [JP] Japan ................... 8-247709

[51] Int. Cl.$^6$ ....................................... G01T 1/20
[52] U.S. Cl. ........................ 250/370.09; 250/370.11
[58] Field of Search ................... 250/370.09, 370.11, 250/368, 369, 367, 366

[56] References Cited

U.S. PATENT DOCUMENTS

| | | | |
|---|---|---|---|
| 4,908,718 | 3/1990 | Shimada | 358/494 |
| 5,430,298 | 7/1995 | Possin et al. | 250/370.09 |
| 5,550,378 | 8/1996 | Skillicorn et al. | 250/367 |

*Primary Examiner*—Michael J. Tokar
*Assistant Examiner*—Richard Hanig
*Attorney, Agent, or Firm*—Fitzpatrick, Cella, Harper & Scinto

[57] ABSTRACT

A photoelectric conversion apparatus comprises a plurality of transparent substrates. Each of the substrates has a a plurality of photoelectric conversion elements on a front surface thereof on a base. A light-absorbing member is provided on at least one of a rear surface and end faces of the substrate.

49 Claims, 23 Drawing Sheets

FIG. 25

| 110 | | | | 210 | | |
|---|---|---|---|---|---|---|
| DAT (1,1) | DAT (1,2) | DAT (1,3) | DAT (1,4) | DAT (1,5) | DAT (1,6) | DAT (1,7) |
| DAT (2,1) | DAT (2,2) | DAT (2,3) | DAT (2,4) | DAT (2,5) | DAT (2,6) | DAT (2,7) |
| DAT (3,1) | DAT (3,2) | DAT (3,3) | DAT (3,4) | DAT (3,5) | DAT (3,6) | DAT (3,7) |
| DAT (4,1) | DAT (4,2) | DAT (4,3) | DAT (4,4) | DAT (4,5) | DAT (4,6) | DAT (4,7) |
| DAT (5,1) | DAT (5,2) | DAT (5,3) | DAT (5,4) | DAT (5,5) | DAT (5,6) | DAT (5,7) |
| DAT (6,1) | DAT (6,2) | DAT (6,3) | DAT (6,4) | DAT (6,5) | DAT (6,6) | DAT (6,7) |
| DAT (7,1) | DAT (7,2) | DAT (7,3) | DAT (7,4) | DAT (7,5) | DAT (7,6) | DAT (7,7) |
| 410 | | | | | | 310 |

5,793,047

PHOTOELECTRIC CONVERSION APPARATUS AND X-RAY IMAGE PICKUP APPARATUS

BACKGROUND OF THE INVENTION

1. Field of the Invention

The present invention relates to a photoelectric conversion apparatus and an X-ray image pickup apparatus and, more particularly, to a photoelectric conversion apparatus in which a plurality of substrates each having a plurality of photoelectric conversion elements are arranged to perform a read operation with respect to a large area, and an X-ray image pickup apparatus using the same.

2. Related Background Art

Conventionally, a read system using a reducing optical system and a CCD type sensor has been used to read information such as an image in an X-ray image pickup apparatus or the like.

With the recent development in photoelectric conversion semiconductor materials using amorphous semiconductors and typified by hydrogenated amorphous silicon (to be referred to as a-Si hereinafter), there has been a remarkable development in a so-called contact type sensor, which is obtained by forming a photoelectric conversion unit having a plurality of photoelectric conversion elements on a large substrate, and can read an information source at 1x magnification.

Amorphous silion, a-Si, can be used not only as a photoelectric conversion semiconductor material for a photoelectric conversion unit but also as a semiconductor material for a thin-film field effect transistor (to be referred to as a TFT hereinafter). Some studies have therefore been made to form a signal processing unit on a large-area substrate, together with a photoelectric conversion element. In addition, since a photoelectric conversion semiconductor layer for photoelectric conversion elements can be commonly used as a semiconductor layer for TFTs, these layers can be formed at the same time.

In forming capacitive elements such as capacitors on the same substrate, if opposed electrodes are insulated from each other, a semiconductor layer may be formed therebetween. This allows the deposition order of films constituting a photoelectric conversion element and/or a TFT to be common to the deposition order of films constituting a capacitive element. Consequently, films for forming the respective types of elements can be formed at the same time in the same process.

There is therefore provided a photoelectric conversion apparatus which allows a high S/N ratio and a decrease in cost, and has a large area, high performance, and excellent characteristics. Some studies have also been made to apply a photoelectric conversion apparatus having photoelectric conversion elements arranged on a large-area substrate in the form of a matrix to a light-receiving device for an X-ray image pickup apparatus.

As a photoelectric conversion apparatus has a larger area and a larger light-receiving surface, it becomes more difficult to completely remove minute dust and the like (e.g., dust peeling off from the wall of a thin-film deposition apparatus in the process of depositing an amorphous silicon layer on a substrate, dust floating in the air in a step, foreign substances adhering to a substrate or the like when a metal layer or the like is deposited) in the manufacturing process. For this reason, an increase in area raises the possibility of occurrence of wiring failures such as a short circuit and an open circuit of wiring layers within one substrate and faults in the respective elements such as photoelectric conversion elements.

With an increase in area, therefore, the efficiency for making satisfactory product decreases. As a result, the cost of a photoelectric conversion apparatus increases.

In order to solve such a problem, a large-area photoelectric conversion apparatus may be manufactured by arranging a plurality of photoelectric conversion units. If a plurality of photoelectric conversion units are arranged in this manner, the area of each substrate decreases. As a result, the manufacturing efficiency increases, and the amount of money lost per substrate can be reduced, thereby attaining a decrease in cost.

With this arrangement, even if one of a plurality of substrates becomes defective, it suffices to replace only the defective substrate. A further decrease in cost can be attained. In some case, a decrease in maintenance cost can also be attained.

In a photoelectric conversion apparatus in which a plurality of substrates are two-dimensionally arranged as described above, light to be received (e.g., light emitted from a phosphor when X-rays from an X-ray source are incident thereon in the case of an X-ray image pickup apparatus) is incident on a photoelectric conversion element substrate, and is reflected by the lower surface or an end face portion to enter the light-receiving portion of the photoelectric conversion element. This may cause a deterioration in optical characteristics, e.g., a decrease in the resolution of the photoelectric conversion apparatus.

SUMMARY OF THE INVENTION

It is an object of the present invention to improve the optical characteristics, e.g., resolution, of a large-area photoelectric conversion apparatus, which is formed by bonding a plurality of photoelectric conversion element substrates, by solving the problem that light to be received, e.g., light emitted from a phosphor layer, is reflected by portions other than photoelectric conversion units, e.g., the lower surface of each photoelectric conversion element and the end portions of each of the bonded substrates, and received.

In order to achieve the above object, according to the present invention, there is provided a photoelectric conversion apparatus having a plurality of substrates, each having a plurality of photoelectric conversion elements on an upper surface thereof, on a base, comprising a light-absorbing member on at least a lower surface or end faces of the substrate.

In addition, according to the present invention, there is provided an X-ray image pickup apparatus comprising photoelectric conversion means including a plurality of substrates, each having a plurality of photoelectric conversion elements on an upper surface thereof, on a base, and a light-absorbing member on at least a lower surface or end faces of each of the substrates, X-ray irradiation means for irradiating X-rays, and a light converter for receiving X-rays and generating light having a different wavelength.

Furthermore, in the above apparatus, the substrate has a photoelectric conversion element formed by stacking a first electrode layer, an insulating layer, a photoelectric conversion semiconductor layer, a semiconductor layer for inhibiting injection of carriers of a first conductivity type, and a second electrode layer, photoelectric conversion means for applying an electric field to the photoelectric conversion element in a direction in which carriers of the first conductivity type generated by signal light incident on the photoelectric conversion semiconductor layer are held therein, and carriers of a second conductivity type different from the first conductivity type are guided toward the second electrode layer, refresh means for applying an electric field to the photoelectric conversion element in a direction in which the carriers of the first conductivity type are guided from the photoelectric conversion semiconductor layer to the second electrode layer, and a signal detection unit for detecting the carriers of the first conductivity type which are stored in the photoelectric conversion semiconductor layer or the carriers of the second conductivity type which are guided to the second layer during a photoelectric conversion operation performed by the photoelectric conversion means.

BRIEF DESCRIPTION OF THE DRAWINGS

FIG. 25 is a view showing the arrangement of data on the substrates of the photoelectric conversion apparatus;

DETAILED DESCRIPTION OF THE PREFERRED EMBODIMENTS

Figure 1:
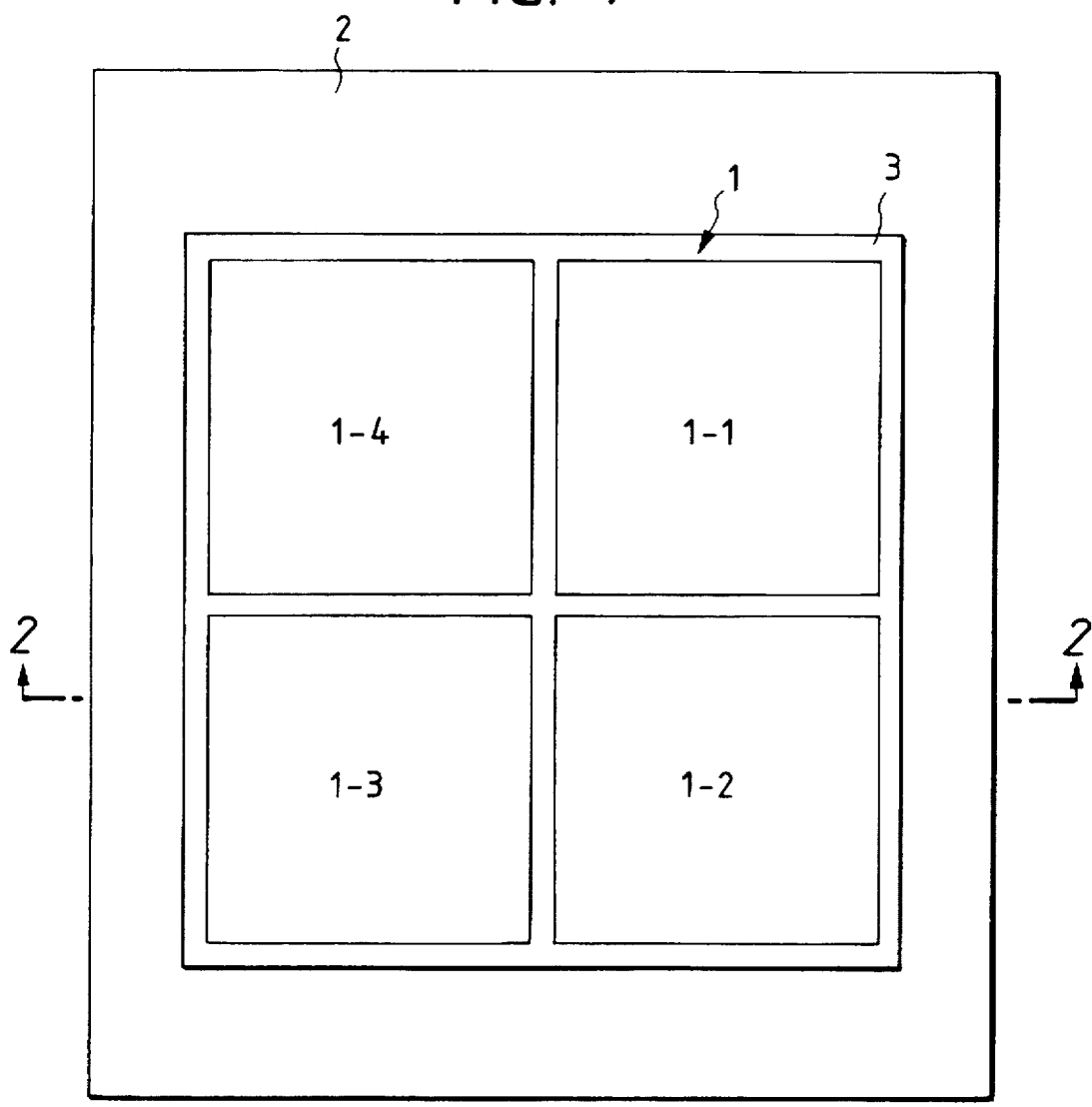
FIG. 1 is a plan view showing a photoelectric conversion apparatus according to a preferred embodiment of the present invention.
Figure 2:
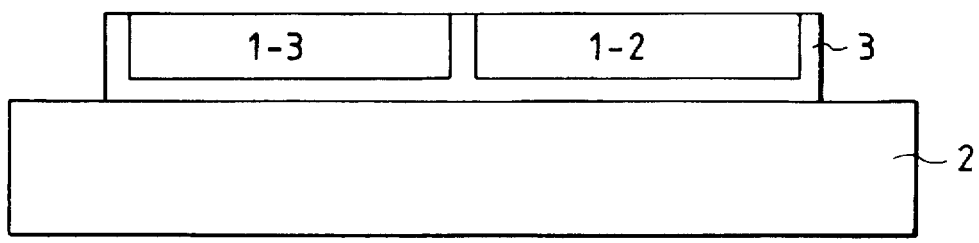
FIG. 2 is a sectional view taken along a line 2—2 in FIG. 1.

FIG. 1 is a schematic plan view showing a photoelectric conversion apparatus according to a preferred embodiment of the present invention. FIG. 2 is a sectional view taken along a line 2—2 in FIG. 1.

A photoelectric conversion element array 1 has a plurality of substrates 1—1, 1-2, 1-3, and 1-4. Each substrate has a group of photoelectric conversion elements on its surface.

A base 2 supports the substrates 1—1, 1-2, 1-3, and 1-4.

The four substrates 1—1 to 1-4 are fixed and bonded to the base 2 with an adhesive 3.

In the present invention, the adhesive 3 serves as a light-shielding member or an antireflection member.

For example, light incident from the substrate (1-1 to 1-4) side is absorbed by the adhesive 3 on the front substrate surface side. This prevents the light from being reflected by the front substrate surface and incident on a photoelectric conversion element group (not shown) on the rear substrate surface side. This function is an antireflection function.

In addition, the adhesive 3 is designed to absorb incident light so as to prevent light incident from a side surface (end face) side of the apparatus from passing through the adhesive 3 and reaching the photoelectric conversion element group on the rear substrate surface side. Similarly, the adhesive 3 absorbs light incident from the front surface of the base 2 from reaching the photoelectric conversion element group on the rear substrate surface through the adhesive 3 on the rear surface side of the base 2. This function is a light-shielding function.

In order to realize the above antireflection and light-shielding functions, the adhesive 3 is made of a light-absorbing material which absorbs light to be received by the photoelectric conversion elements. A light-absorbing material used in the present invention need not absorb light of all wavelengths, but need only absorb light components which become noise components when received and photoelectrically converted by the photoelectric conversion elements.

For example, in a photoelectric conversion apparatus for an X-ray image pickup apparatus, it suffices if the light-absorbing material absorbs light emitted from phosphors as light converters, as will be described later.

A light-absorbing material used in the present invention, therefore, may be a black material or a material having a color complementary to the color of light to be received by the photoelectric conversion elements.

In the above case, the adhesive serves as a light-absorbing material. However, the function of an adhesive and the function of a light-absorbing material can be separated from each other. As a material for a light-absorbing member used in the present invention, an inorganic material such as a metal oxide or an organic material such as a resin is available.

Methods of forming a light-absorbing member made of an organic material include a method of directly coloring a resin by using a dye, and a method of properly mixing a resin with a light-absorbing pigment. As a method which is generally easy to practice, a method of obtaining a desired hue by properly mixing a resin with a pigment or pigments is preferably used.

As the types of pigment to be used, the following organic pigments are available: nitro-based coloring agents, azo pigment, indanthrene, thioindigo Perynone, perylene, dioxazine, quinacridone, phthalocyanine, isoindolin, quinophthalone-based pigments, and the like. The following inorganic pigments are also available: carbon black, chrome yellow, cadmium yellow, clover million (orange), red iron oxide, vermilion oxide, red lead, cadmium red, mineral violet, cobalt blue, cobalt green, chrome oxide (green), viridian (green), and the like.

A light-absorbing member having a desired hue or a black light-absorbing member can be formed by properly selecting one of these pigments in accordance with the oscillation wavelength of a phosphor.

As the resin used for a light-absorbing member in the present invention, an epoxy resin, an acrylic resin (methacrylic resin), and a silicone resin are available.

As the epoxy resin, BAE epoxy resin as a condensate of bisphenol A and epichlorohydrin, which is used most widely in practice, is available. In addition, as resins containing this resin as a main component, the following resins are available: bisphenol F, its homologues, and halogenated resins thereof, a resin obtained by introducing an epoxy group into polyalcohol, dimer acid, trimer acid, or novolak phenolic resin with epichlorohydrin, a resin obtained by introducing an epoxy group into a polyolefin with a peroxide, an epoxy resin called cycloaliphatic epoxy resin, and the like. The usage of BAE epoxy resin has been sufficiently studied, together with the characteristics of the cured substance with respect to each curing agent, and there are sufficient data about BAE epoxy resin. This material can therefore be used safely.

As the curing agent, one of the following agents can be used to obtain an epoxy resin having properties suitable for a coating step: diethylenetriamine, n-aminoethylpiperazine, benzylmethylamine, methaphenylenediamine, diaminodiphenylmethane, diaminodiphenylethane, polyamide resin, dicyandiamide, boron trifluoride monoethylamine, ethylmethylimidazole, phthalic anhydride, hexahydrophthalic anhydride, methylnadic anhydride, pyromellitic anhydride, chlorendic anhydride, and the like.

As the acrylic resins (methacrylic resins), three types of resins having different polymeric forms are known: a cast-in polymer obtained by bulk polymerization of a monomer or syrup, a granular resin obtained by suspension polymerization, and a granular resin obtained by using an extruder with respect to a powder formed by suspension polymerization. One of these resins which is most suitable for a coating step can be selected and used.

As the silicone resin, a methyl-based silicone resin using trichlorosilane and dichlorosilane, a phenyl-based silicone resin, and a silicone alkyd resin are available. A suitable resin may be selected and used in accordance with the coating method selected.

As the method of arranging light-absorbing members used in the present invention at predetermined positions, a sputtering method, a vacuum deposition method, a CVD method, or the like is available. Of these methods, sputtering is preferably used to form an inorganic light-absorbing layer on a substrate.

As the method of forming an organic light-absorbing layer, a spin coating method, a curtain coating method, a screen printing method, a transfer method such as offset printing, a coating method using a dispenser, or the like may be used.

The sputtering method will be described in detail below.

Figure 3:
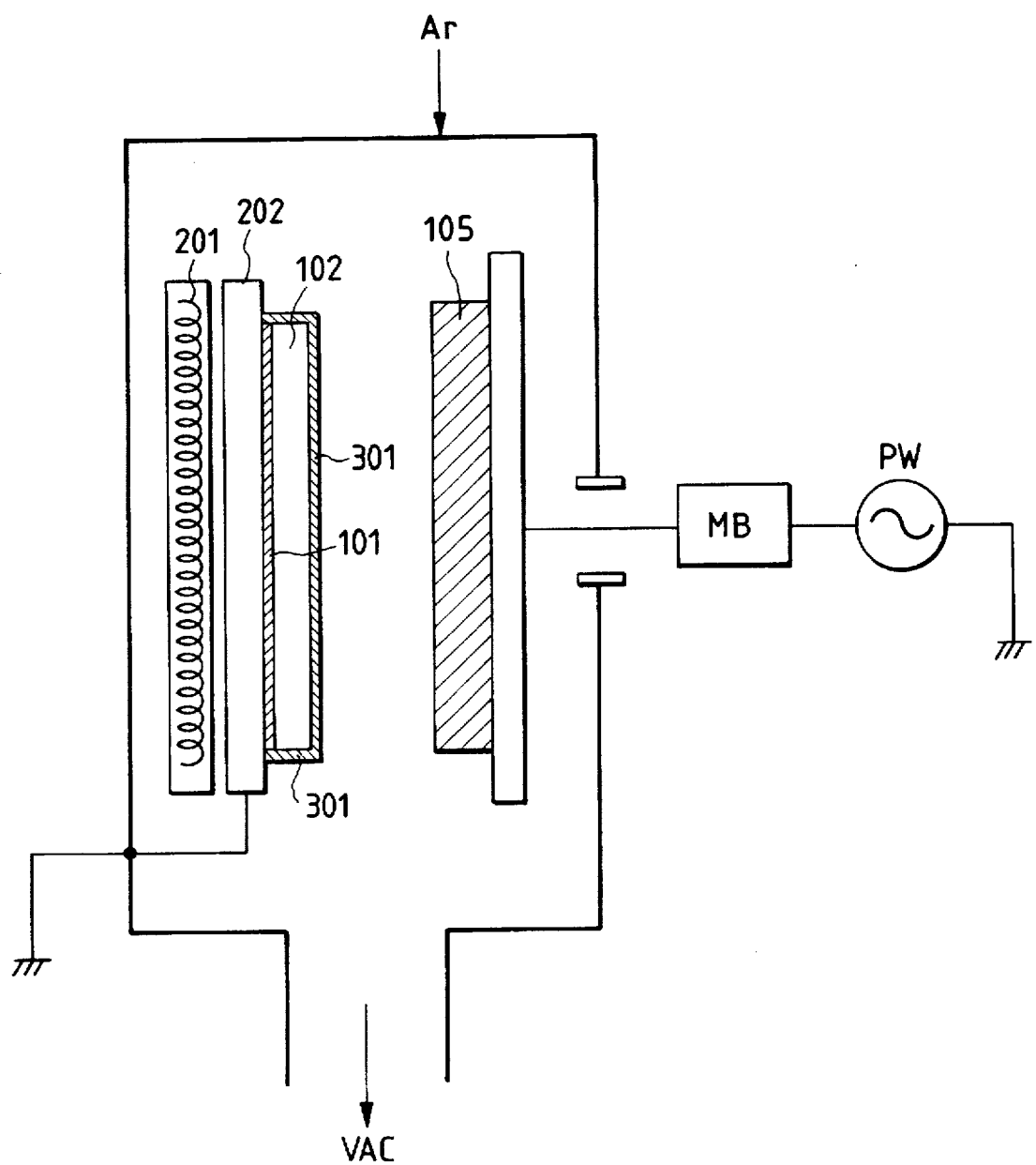
FIG. 3 is a schematic view showing an apparatus for forming a light-absorbing member used in the present invention.

FIG. 3 is a view for explaining a film forming apparatus for forming a light-absorbing layer 301 consisting of a metal oxide on the front and side surfaces of a substrate 102 by the sputtering method.

As shown in FIG. 3, the chamber contains a heater 201 for heating the substrate 102, a holder 202 for holding the substrate 102, and a target ($Ta_2O_3$) 105 to be deposited as the light-absorbing layer 301 on the front and side surfaces of the substrate 102. The holder 202 is set such that the opposite surface of a photoelectric conversion element surface 101 faces the target 105.

The chamber is evacuated to a vacuum of $1 \times 10^{-6}$ Torr by a pump. At this vacuum, Ar gas is fed into the chamber up to 5 mTorr. The heater 201 is then energized to heat the substrate 102, and a high-frequency voltage is applied from a power supply PW to cause glow discharge between the target 105 and the substrate 102, thereby forming the light-absorbing layer 301 on the front and side (end faces) surfaces of the substrate 102.

A coating method and print method for a light-absorbing layer used in the present invention will be described next with reference to FIGS. 4A to 4C. In this case, a light-absorbing layer is formed on the front and side surfaces of a glass substrate.

Figure 4A:
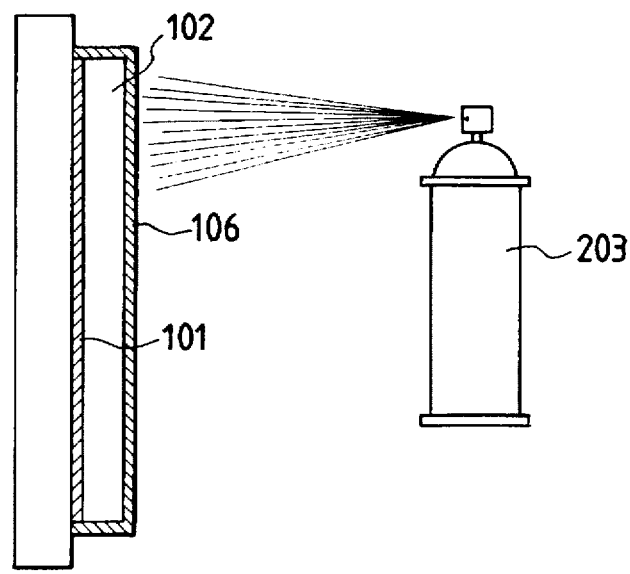
FIGS. 4A to 4C are schematic views showing a method of forming a light-absorbing member used in the present invention.

FIG. 4A shows how a black resin 106 is applied to the front and side surfaces of the glass substrate 102 by using a spray 203 in the coating method.

Figure 4B:
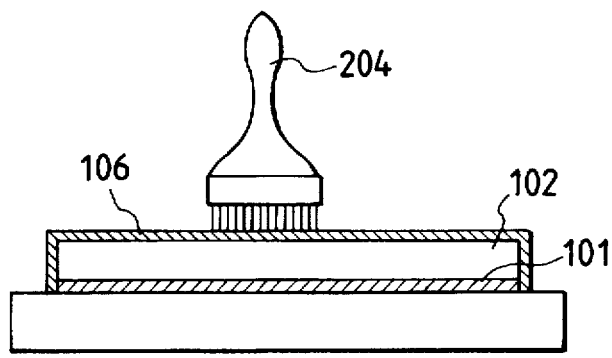

FIG. 4B shows how the black resin 106 is applied to the front and side surfaces of the glass substrate 102 with a brush 204.

Figure 4C:
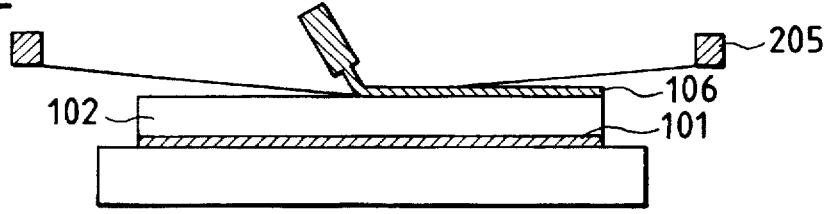

FIG. 4C shows how the black resin 106 is applied to the front surface of the substrate 102 by using a screen printed plate 205.

Methods of bonding a plurality of glass substrates to one common base includes a method of bonding a plurality of substrates to a base with an adhesive or the like after a light-absorbing layer is formed on the front and side surfaces of each glass substrate by one of the above methods, i.e., the sputtering method, the print method, and the coating method.

If a light-absorbing layer also serves as an adhesive, the following method may be used. In this method, after a light-absorbing adhesive is applied to the rear surface of a base, a plurality of substrates are mounted on the base, and the adhesive is cured.

The structure of a photoelectric conversion element used in the present invention will be described next.

Figure 5A:
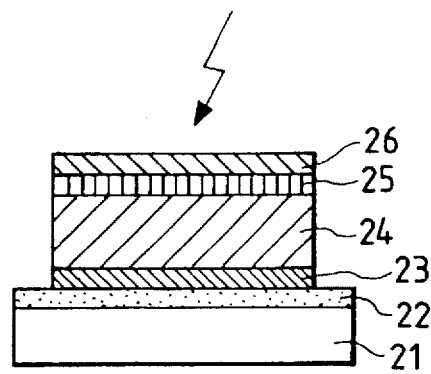
FIGS. 5A to 5C are schematic views for explaining a photoelectric conversion element.
Figure 5B:
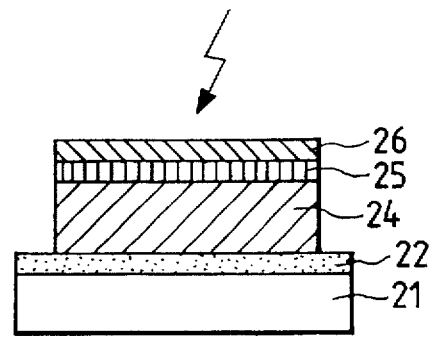
Figure 5C:
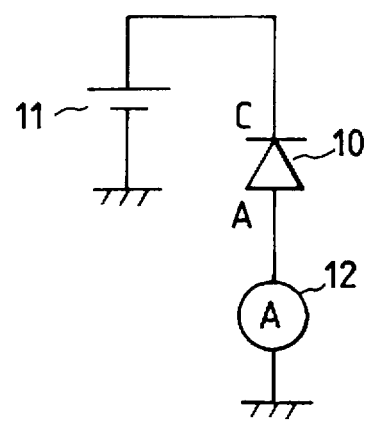

FIGS. 5A to 5C show the structure of a given optical sensor. FIGS. 5A to 5C show the structures of conventional optical sensors. FIGS. 5A and 5B show the layer structures of two types of optical sensors. FIG. 5C shows a typical driving method common to these sensors. Both the sensors in FIGS. 5A and 5B are photodiode type optical sensors. The sensor in FIG. 5A is of a PIN type. The sensor in FIG. 5B is of a Schottky type. The sensor in FIG. 5A includes an insulating substrate 21, a lower electrode 22, a p-type semiconductor layer (p-layer) 23, an intrinsic semiconductor layer (i-layer) 24, an n-type semiconductor layer (n-layer) 25, and a transparent electrode 26. The sensor in FIG. 5B includes the same components as those of the sensor in FIG. 5A except for the p-layer 23. In the Schottky type sensor in FIG. 5B, a proper material is selected for the lower electrode 22 to form a Schottky barrier such that no electrons are injected from the lower electrode 22 into the i-layer 24. The arrangement in FIG. 5C includes an optical sensor 10 as a symbol representing the above optical sensor, a power supply 11, and a detection unit 12 such as a current amplifier. The direction indicated by "C" in the optical sensor 10 corresponds to the transparent electrode 26 side in FIGS. 5A and 5B, whereas the direction indicated by "A" corresponds to the lower electrode 22 side. The power supply 11 is set to apply a positive voltage to the "C" side with reference to the "A" side.

The operation of this arrangement will be briefly described. When light is incident from the direction indicated by the arrow in each of FIGS. 5A and 5B, and reaches the i-layer 24, the light is absorbed to generate electrons and holes. Since an electric field has been applied from the power supply 11 to the i-layer 24, the electrons pass through the "C" side, i.e., the n-layer 25, and move to the transparent electrode 26, while the holes move to the "A" side, i.e., the lower electrode 22. That is, a photocurrent flows in the optical sensor 10. When no light is incident, neither electrons nor holes are generated in the i-layer 24. In addition, the n-layer 25 serves as a hole injection inhibiting layer, and the p-layer 23 in the PIN type sensor in FIG. 5A and the Schottky barrier layer in the Schottky type sensor in FIG. 5B serve as electron injection inhibiting layers. For this reason, the holes in the transparent electrode 26 and the electrons in the lower electrode 22 cannot move, and hence no current flows. Therefore, a change in current occurs in accordance with the presence/absence of incident light. If this change is detected by the detection unit 12 in FIG. 5C, this arrangement operates as an optical sensor.

It is, however, difficult to manufacture a photoelectric conversion apparatus with a high S/N ratio at a low cost by using the above conventional optical sensor. The following are the reasons for this assertion.

The first reason is that the PIN type sensor in FIG. 5A and the Schottky type sensor in FIG. 5B each require injection inhibiting layers at two portions. In the PIN type sensor in FIG. 5A, the n-layer 25 as an injection inhibiting layer needs to have both the characteristic that guides electrons to the transparent electrode 26 and the characteristic that inhibits injection of holes into the i-layer 24. Lack of one of the characteristics leads to a decrease in photocurrent, or generation of or an increase in a current (dark current) without incident light, resulting in a decrease in S/N ratio. This dark current itself is regarded as noise and includes a fluctuation called shot noise, i.e., quantum noise. Even if such a dark current is removed by the detection unit 12, quantum noise accompanying the dark current cannot be reduced. In general, in order to improve the above characteristics, the conditions for formation of the i-layer 24 and the n-layer 25 and the conditions for annealing after formation of such layers must be optimized. However, the p-layer 23 which is another injection inhibiting layer needs to have the same characteristics as those described above, although the relationship between the electrons and holes is opposite to the above relationship. The respective conditions for the p-layer 23 must also be optimized. In general, the optimal conditions for the former n-layer are not the same as those for the latter p-layer, and it is difficult to satisfy the conditions for both the layers. That is, requiring injection inhibiting layers at two portions in a single optical sensor makes it difficult to form an optical sensor with a high S/N ratio. This applies to the Schottky type sensor in FIG. 5B as well.

The Schottky type sensor in FIG. 5B uses a Schottky barrier layer as one injection inhibiting layer. This layer uses the difference in work function between the lower electrode 22 and the i-layer 24. For this reason, the materials for the lower electrode 22 are limited, and the localized level of the interface greatly influences the characteristics of the Schottky barrier layer, making it more difficult to satisfy the conditions for the layer. It is also reported that a thin silicon or metal oxide or nitride film having a thickness of about 100 Å can be formed between the lower electrode 22 and the i-layer 24 to improve the characteristics of the Schottky barrier layer. This structure uses a tunnel effect to guide holes to the lower electrode 22 and improve the effect of inhibiting injection of electrons into the i-layer 24. The structure also uses the difference in work function, and hence the materials for the lower electrode 22 are limited. Furthermore, since the structure uses opposite properties, i.e., inhibition of injection of electrons and movement of holes by means of the tunnel effect, the oxide or nitride film is limited to a very thin film having a thickness of about 100 Å. Moreover, since it is difficult to control thickness and film quality, the productivity decreases.

Requiring injection inhibiting layers at two portions leads to low productivity and high cost for the following reason. These two injection inhibiting layers are important in terms of characteristics. if, therefore, a defect is produced in one of the two layers by dust or the like, good characteristics necessary for an optical sensor cannot be obtained.

Figure 6:
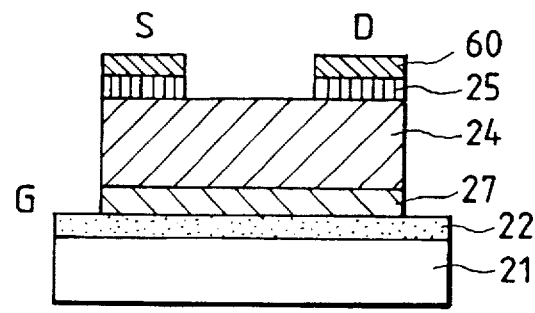
FIG. 6 is a sectional view showing another photoelectric conversion element.

The second reason will be described with reference to FIG. 6. FIG. 6 shows the layer structure of a field effect transistor (TFT) made of thin semiconductor layers. A TFT is sometimes used as part of a control unit in forming a photoelectric conversion apparatus. The same reference numerals in FIG. 6 denote the same parts as in FIGS. 5A to 5C. This TFT includes a gate insulating film 27 and an upper electrode 60. A method of forming the TFT will be described in orderly sequence. A lower electrode 22 serving as a gate electrode (G), a gate insulating film 27, an i-layer 24, an n-layer 25, and an upper electrode 60 serving as source and drain electrodes (S and D) are sequentially formed on an insulating substrate 21. The upper electrode 60 is etched to form source and drain electrodes. Thereafter, the n-layer 25 is etched to form a channel portion. The characteristics of the TFT are easily influenced by the state of the interface between the gate insulating film 27 and the i-layer 24. In general, in order to prevent contamination of the interface, these layers are continuously deposited in the same vacuum.

This layer structure poses a problem in forming a conventional optical sensor on the same substrate on which this TFT is formed, resulting in an increase in cost and a deterioration in characteristics. This is because the layer structures of the conventional sensors in FIGS. 5A and 5B are different from the layer structure of the TFT. More specifically, the PIN type sensor in FIG. 5A has the electrode/p-layer/i-layer/n-layer/electrode structure, and the Schottky type sensor in FIG. 5B has the electrode/i-layer/ n-layer/electrode structure. In contrast to this, the TFT has the electrode/insulating layer/i-layer/n-layer/electrode structure. That is, these structures cannot be formed in the same process. A complication of processes results in a decrease in yielding ratio and an increase in cost. In order to share the i-layer/n-layer, an etching process is required for the gate insulating film 27 or the p-layer 23. For this reason, the p-layer 23 as an injection inhibiting layer which is an important layer of the above optical sensor and the i-layer 24 cannot be formed in the same vacuum, or the interface between the gate insulating film 27 which is important to the TFT and the i-layer 24 is contaminated upon etching of the gate insulating film, resulting in a deterioration in characteristics and a decrease in S/N ratio.

Figure 7:
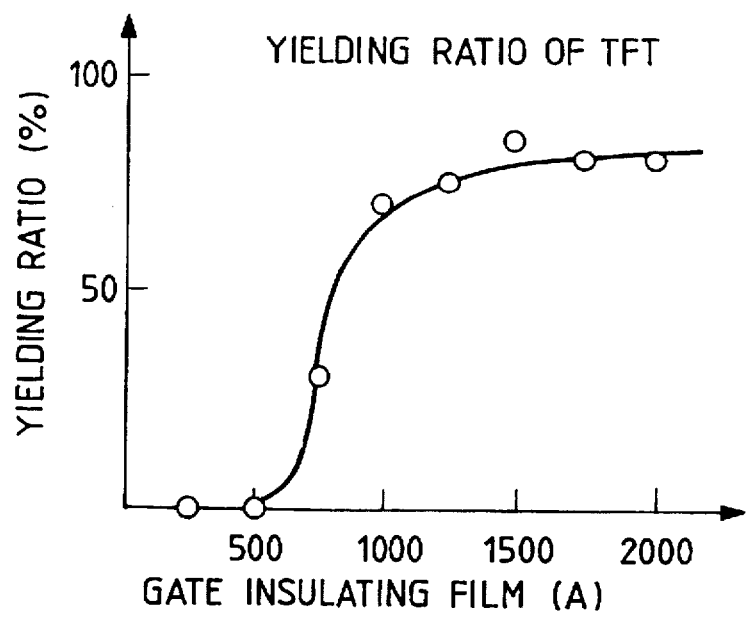
FIG. 7 is a graph showing the yielding ratio dependence of a TFT on the gate insulating film.

The structure, which has an oxide or nitride film formed between the lower electrode 22 and the i-layer 24 to improve the characteristics of the Schottky type sensor in FIG. 5B, is identical to the structure in FIG. 6 in terms of the order of the layers formed. However, as described above, the oxide or nitride film needs to have a thickness of about 100 Å, and hence it is difficult to use it as a gate insulating film. FIG. 7 shows the result obtained by an experiment on the yielding ratio of TFTs in relation to the gate insulating film. Below a gate insulating film thickness of 1,000 Å, the yielding ratio exhibited an abrupt decrease. At a thickness of 800 Å, the yielding ratio was about 30%. At a thickness of 500 Å, the yielding ratio was 0%. At a thickness of 250 Å, even the operation of the TFT could not be detected. This data clearly shows that it is difficult to use the oxide or nitride film of an optical sensor using a tunnel effect as the gate insulating film of a TFT which needs to insulate electrons and holes.

In addition, although not shown, a capacitive element (to be referred to as a capacitor hereinafter) having good characteristics with a small amount of leakage current, which is an element required to obtain the integral value of charges or currents, is difficult to form with the same structure as that of a conventional optical sensor. Since a capacitor is intended to store charges between two electrodes, a layer for inhibiting movement of electrons and holes is required as an intermediate layer between the electrodes. A conventional optical sensor, however, uses only a semiconductor layer between electrodes. For this reason, it is difficult to obtain an intermediate layer having good characteristics which is thermally stable and has small leakage current.

If a TFT and a capacitor, which are the important elements of a photoelectric conversion apparatus, exhibit poor matching in terms of process and characteristics, many complicated steps are required to form a system having many one- or two-dimensional optical sensors and designed to sequentially detect optical signals. For this reason, the yielding ratio is very low, posing a serious problem in forming a high-performance, multifunctional apparatus at a low cost.

The following photoelectric conversion apparatus can solve these problems and can be suitably used in the present invention.

Figure 9A:
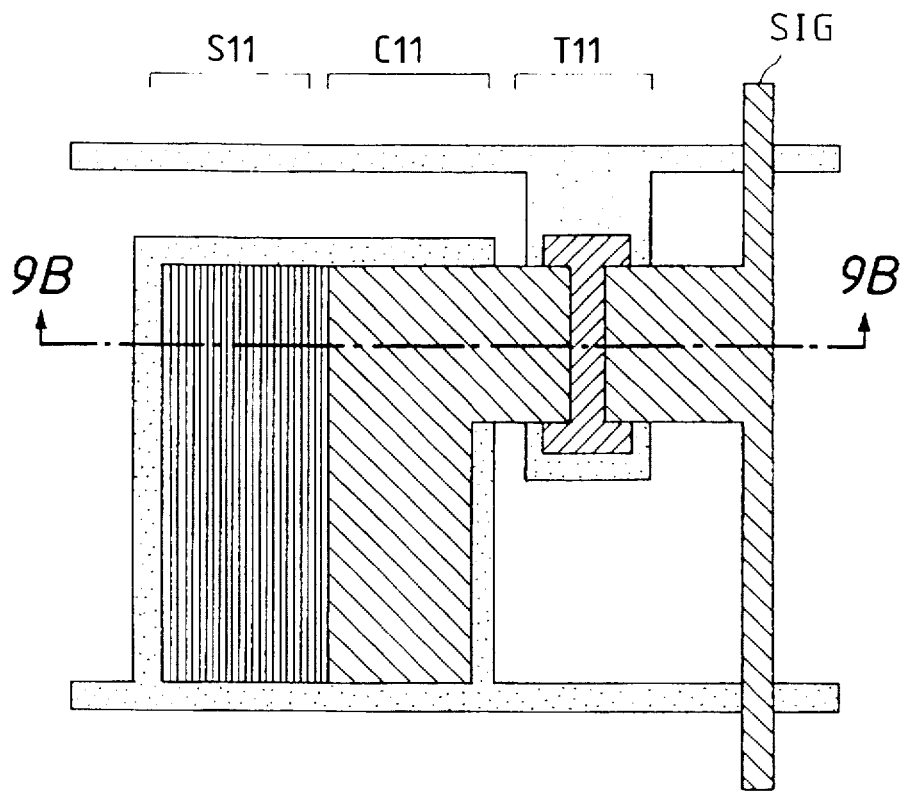
FIGS. 9A and 9B are schematic views showing the structure of a photoelectric conversion element used in the present invention.
Figure 9B:
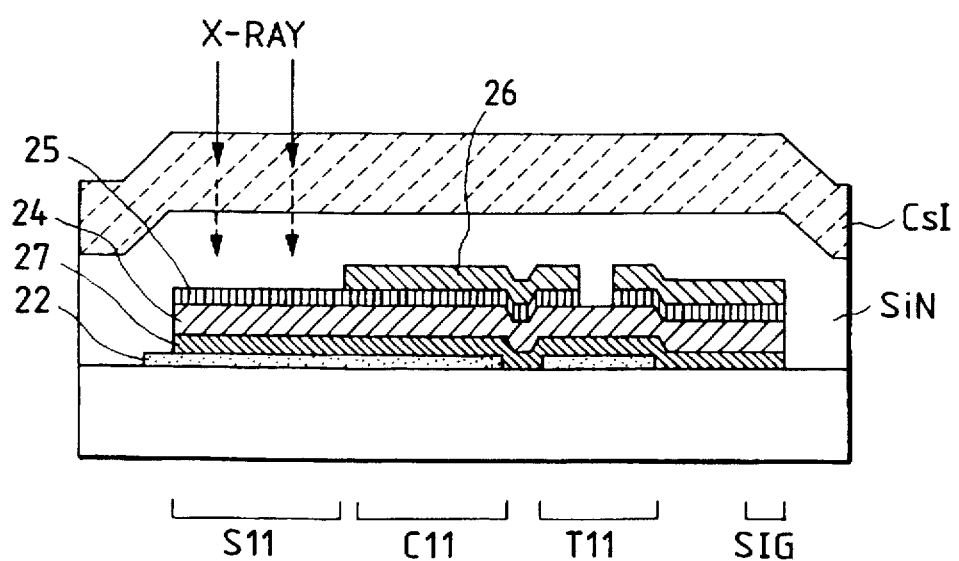
Figure 11:
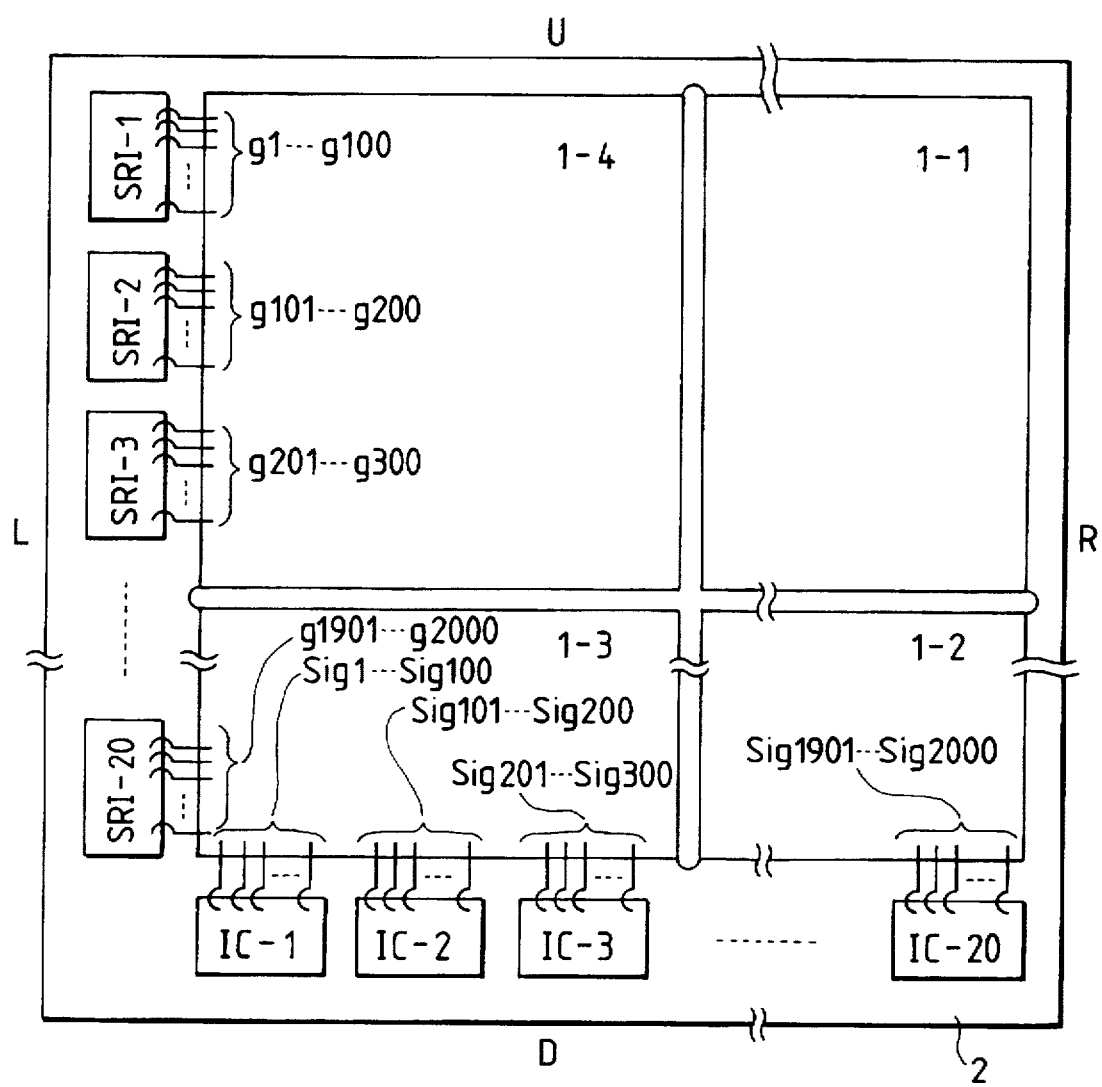
FIG. 11 is a plan view showing a photoelectric conversion apparatus according to an embodiment of the present invention.

FIG. 11 is a circuit diagram showing the overall arrangement of a photoelectric conversion apparatus used in the present invention. FIG. 9A is a plan view showing a constituent element corresponding to one pixel of this photoelectric conversion apparatus. FIG. 9B is a sectional view taken along a line 9B—9B in FIG. 9A.

Figure 8:
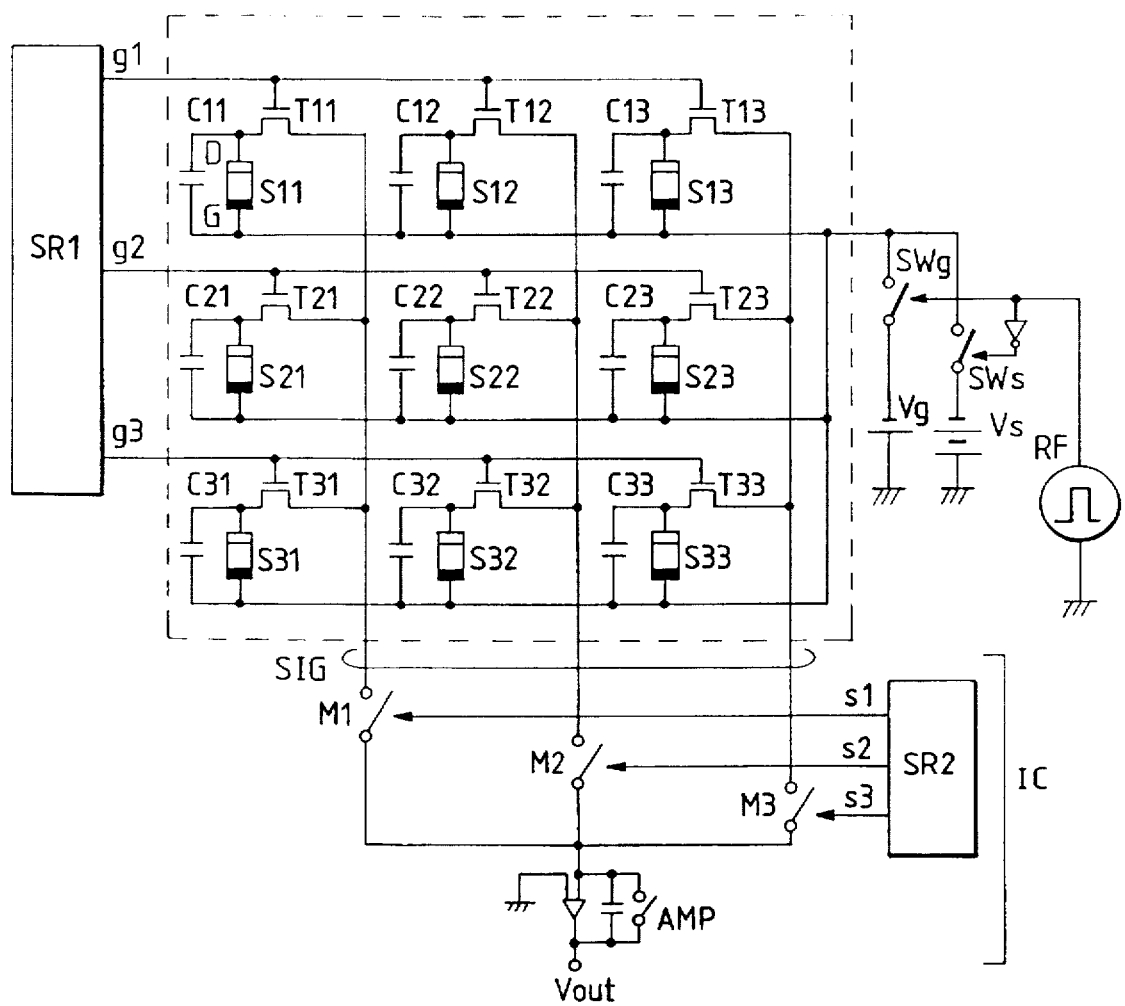
FIG. 8 is a circuit diagram showing a photoelectric conversion apparatus of the present invention.

Referring to FIG. 8, this apparatus includes photoelectric conversion elements S11 to S33. The lower and upper electrode sides of each element are respectively indicated by "G" and "D". The apparatus also includes storage capacitors C11 to C33, transfer TFTs T11 to T33, a read power supply Vs, and a refresh power supply Vg. These power supplies are connected to the G electrodes of all the photoelectric conversion elements S11 to S33 through switches SWs and SWg, respectively. The switch SWs is connected to a refresh control circuit RF through an inverter, and the switch SWg is directly connected to the refresh control circuit RF. The switch SWg is controlled to be kept ON in the refresh interval. One pixel is constituted by one photoelectric conversion element, one capacitor, and one TFT. The signal output from each pixel is connected to a detection integrated circuit IC through a signal line SIG. In the photoelectric conversion apparatus previously proposed by the present applicant, a total of nine pixels are divided into three blocks, the outputs from three pixels per block are transferred through each signal line SIG at the same time, and the outputs are sequentially converted into outputs (Vout) by the detection integrated circuit IC. The three pixels in each block are arranged in the horizontal direction, and the three blocks are sequentially arranged in the vertical direction, thereby two-dimensionally arranging the pixels.

The portion enclosed within the dotted line in FIG. 8 is formed on a single insulating substrate having a large area. FIG. 9A is a plan view showing a portion corresponding to the first pixel of the above portion. FIG. 9B is a sectional view taken along a line 9B—9B of the portion in FIG. 9A. This structure includes the photoelectric conversion element S11, the TFT T11, the capacitor C11, and the signal line SIG. In the photoelectric conversion apparatus previously proposed by the present applicants, the capacitor C11 and the photoelectric conversion element S11 are not isolated from each other, and the capacitor C11 is formed by increasing the area of an electrode of the photoelectric conversion element S11. Such a formation process can be employed because each photoelectric conversion and each capacitor in this embodiment have the same layer structure. This is a characteristic feature of the photoelectric conversion apparatus previously proposed by the present applicants. In addition, a passivation silicon nitride film (SiN) and a phosphor (CsI) such as cesium iodide are formed on each pixel. When X-rays are incident on the pixel, the X-rays are converted into light (indicated by the dotted arrows) by the phosphor (CsI), and this light is incident on the photoelectric conversion element. In this manner, a phosphor serves as a light converter for receiving light having a given wavelength and emitting light having a different wavelength.

Figure 10:
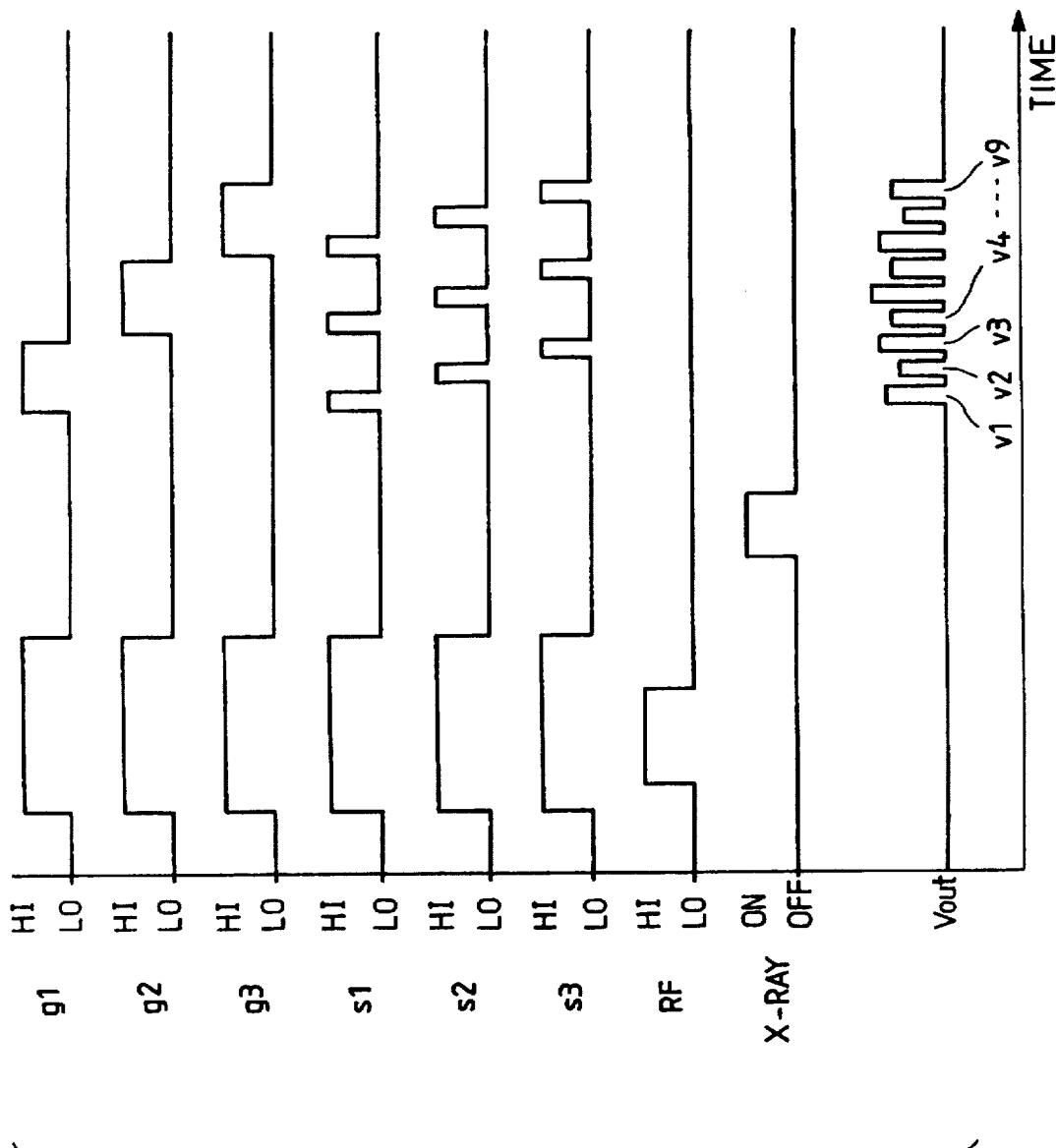
FIG. 10 is a timing chart showing the drive timing of the photoelectric conversion apparatus of the present invention.

The operation of the photoelectric conversion apparatus will be described next with reference to FIGS. 8 to 10. FIG. 10 is a timing chart showing the operation of the apparatus in FIG. 3.

First of all, High-level signals are applied from shift registers SR1 and SR2 to control lines g1 to g3 and sg1 to sg3. As a result, the transfer TFTs T11 to T33 and switches M1 to M3 are turned on, and the D electrodes of all the photoelectric conversion elements S11 to S33 are set to the GND potential (because the input terminal of an integrating detector Amp is set to the GND potential). At the same time, the refresh control circuit RF outputs a High-level signal to turn on the switch SWg. As a result, the G electrodes of the photoelectric conversion elements S11 to S33 are set to a positive potential by the refresh power supply Vg. All the photoelectric conversion elements S11 to S33 are then set in the refresh mode to be refreshed. When the refresh control circuit RF outputs a Low-level signal to turn on the switch SWs, the G electrodes of all the photoelectric conversion elements S11 to S33 are set to a negative potential by the read power supply Vs. As a result, all the photoelectric conversion elements S11 to S33 are set in the photoelectric conversion mode. At the same time, the capacitors C11 to C33 are initialized. In this state, the shift registers SR1 and SR2 apply Low-level signals to the control lines g1 to g3 and sg1 to sg3. As a result, the switches M1 to M3 for the transfer TFTs T11 to T33 are turned off, and the D electrodes of all the photoelectric conversion elements S11 to S33 are set in the open state in terms of the DC component. However, the potentials of the D electrodes are held by the capacitors C11 to C33. At this time, however, since no X-rays are incident, light is incident on none of the photoelectric conversion elements S11 to S33. No photocurrents therefore flow. When X-rays are emitted in the form of pulses and traverse a human body or the like to be incident on the phosphor CsI, the X-rays are converted into light. The light is incident on each of the photoelectric conversion elements S11 to S33. The light contains information of the internal structure of the human body or the like. Photocurrents generated by the light are stored as charges in the capacitors C11 to C33 and held after the incidence of the X-rays. Thereafter, the shift register SR1 applies a high-level control pulse to the control line g1, and the shift register SR2 applies control pulses to the control lines s1 to s3. As a result, data v1 to v3 are sequentially output through the switches M1 to M3 of the transfer TFTs T11 to T33. Similarly, other optical signals are sequentially output under the control of the shift registers SR1 and SR2. With this process, two-dimensional data v1 to v9 of the internal structure of the human body or the like can be obtained. A still image can be obtained by the above operation. When, however, a motion image is to be obtained, the above operation is repeated.

In this photoelectric conversion apparatus, the G electrodes of the photoelectric conversion elements are commonly connected, and the common line is controlled to be set to the potential of the refresh power supply Vg and the potential of the read power supply Vs via the switches SWg and SWs. For this reason, all the photoelectric conversion elements can be switched to the refresh mode or the photoelectric conversion mode at once. Therefore, an optical output can be obtained with one TFT per pixel without complicated control.

In this apparatus, the nine pixels are two-dimensionally arranged in a 3×3 matrix, and three pixel data are transferred and output, at a time, three times. However, the present invention is not limited to this. If, for example, 2,000×2,000 pixels are two-dimensionally arranged such that 5×5 pixels are arranged per 1 mm$^2$, a 40 cm×40 cm X-ray detector can be obtained. If this detector is combined with an X-ray generator, instead of an X-ray film, to constitute an X-ray apparatus, the apparatus can be used for an X-ray chest examination and a breast cancer examination. The output from the apparatus can be instantly displayed on a CRT. In addition, this output can be converted into digital data, and a computer is used to perform image processing of the data to convert it into an output in accordance with the application. Furthermore, this data can be stored in a magnetooptic disk, and a past image can be instantly retrieved. The sensitivity of this detector is higher than that of a film so that a clear image can be obtained with weak X-rays having little effect on human bodies.

Figure 12:
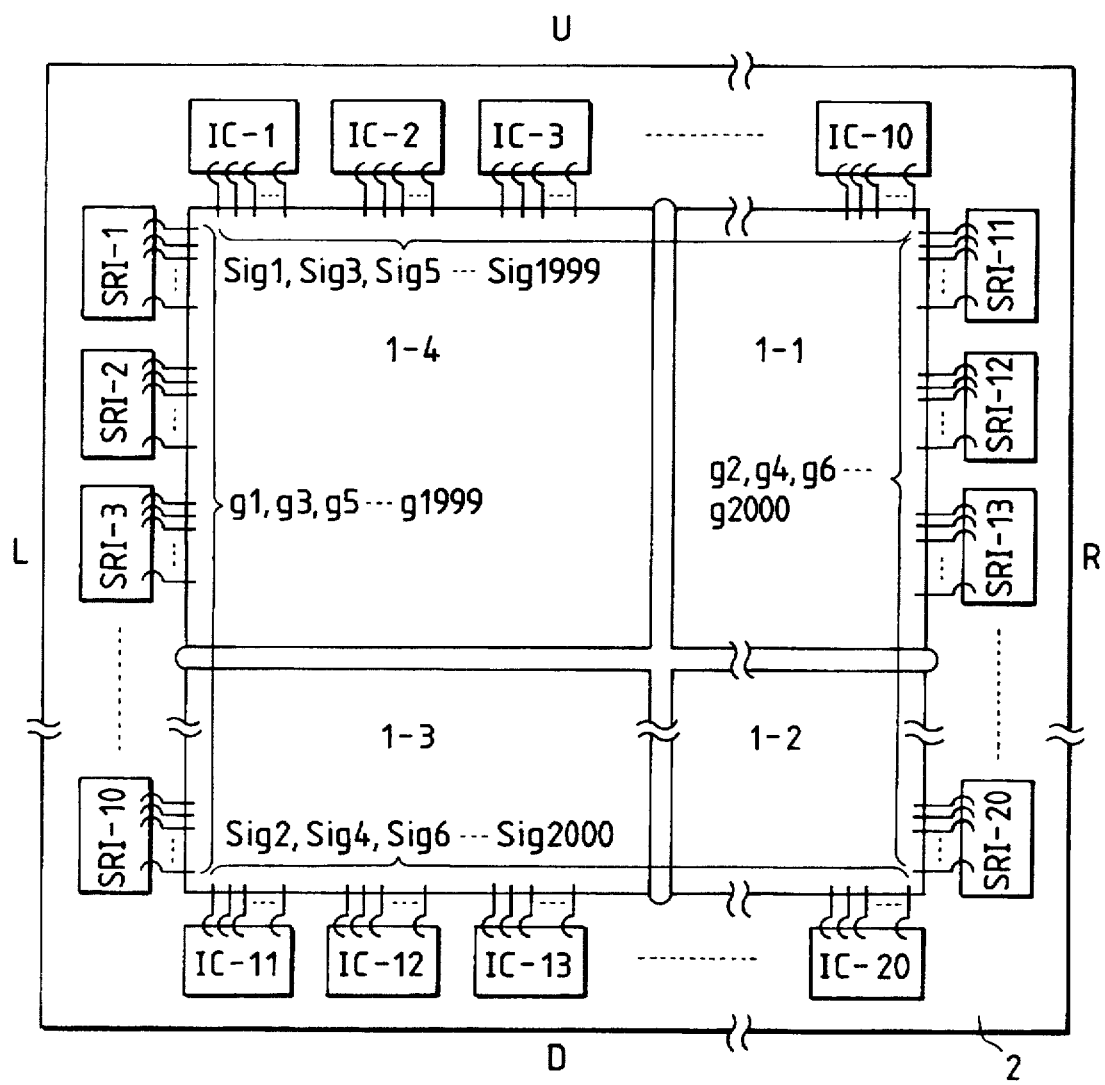
FIG. 12 is a plan view showing a photoelectric conversion apparatus according to another embodiment of the present invention.

FIGS. 11 and 12 are plan views each showing the arrangement of a detector having 2,000×2,000 pixels. When a detector having 2,000×2,000 pixels is to be formed, the numbers of elements in the portion enclosed within the dotted line in FIG. 8 may be increased in the vertical and horizontal directions. In this case, however, 2,000 control lines, i.e., lines g1 to g2000, and 2,000 signal lines SIG, i.e., lines sig1 to sig2000 are required. In addition, the shift register SR1 and the detection integrated circuit IC need to perform control/processing of 2,000 signals, and hence the apparatus increases in size. If such processing is performed using one-chip elements, the size of one chip becomes very large, resulting in disadvantages in terms of yielding ratio, cost, and the like. In view of the foregoing, for example, 2,000 shift registers SR1 may be divided into 20 chips (SR1-1 to SR1-20) each including 100 shift registers. Similarly, 2,000 detection integrated circuits may be divided into 20 chips (IC1 to IC20) each including 100 processing circuits.

Referring to FIG. 11, 20 chips (SR1-1 to SR1-20) are mounted on the left side (L), and 20 chips (IC1 to IC20) are mounted on the down side (D), while 100 control lines or 100 signal lines are connected to each chip by wire bonding. Referring to FIG. 11 illustration of connection to an external unit is omitted, and illustration of switches SWg, SWs, and SWx, power supplies Vg1, Vg2, and RF, and the like is also omitted. Although 20 outputs (Vout) are obtained from the integrated circuits IC1 to IC20, these outputs may be combined into one output through a switch or the like, or the 20 outputs may be directly output to be subjected to parallel processing. Photoelectric conversion elements are formed on four substrates 1-1, 1-2, 1-3, and 1-4. These four substrates are then bonded onto one common base 2.

FIG. 12 shows another structure. Referring to FIG. 12, 10 chips (SR1-1 to SR1-10) may be mounted on the left side (L); 10 chips (SR1-11 to SR1-20), on the right side (R); 10 chips (IC1 to IC10), on the upper side (U); and 10 chips (IC11 to IC20), on the down side (D). In this arrangement, since the respective lines are distributed to the upper, down, left, and right sides (U, D, L, and R) in units of 1,000, the density of lines on each side decreases, and the density of wiring bonding on each side also decreases, resulting in an increase in yielding ratio. The lines are distributed such that the lines g1, g3, g5, . . . , g1999 are distributed on the left side (L), and the lines g2, g4, g6, . . . , g2000 are distributed on the right side (R). That is, the odd-numbered control lines are distributed on the left side (L), and the even-numbered control lines are distributed on the right side (R). With this distribution, since the respective lines are arranged and wired at equal intervals, no density irregularity occurs. Consequently, the yielding ratio can be further increased. It suffices if the remaining lines are distributed on the upper side (U) and the down side (D) in the same manner as described above. According to another embodiment, although not shown, lines g1 to g100, g201 to g300, . . . , g1801 to g1900 are distributed on the left side (L), and lines g101 to g200, g301 to g400, . . . , g1901 to g2000 are distributed on the right side (R). That is, consecutive control lines are distributed to each chip, and such groups of lines are alternately distributed on the right and left sides (R and L). With this distribution, continuous control is allowed within one chip, and the drive timings can be easily set, so a simple, inexpensive circuit can be used. Distribution of lines on the upper side (U) and the down side (D) is performed in the same manner as described above, so continuous processing can be performed, and an inexpensive circuit can be used. In this apparatus, photoelectric conversion elements are formed on four substrates 1-1, 1-2, 1-3, and 1-4, and these four substrates are bonded onto one common base 2.

Each of the structures shown in FIGS. 11 and 12 may be obtained by mounting chips on four substrates after the circuit enclosed within the dotted line is formed on each substrate, or mounting the four circuit boards 1-1 to 1-4 and the chips on the base 2. Alternatively, chips may be mounted on a flexible board, and the board may be bonded to the circuit board enclosed within the dotted line.

A photoelectric conversion apparatus including many pixels and having a large area, like the one described above, cannot be manufactured by complicated steps using the conventional sensors. However, in the steps in manufacturing the photoelectric conversion apparatus shown in FIGS. 8 to 10, the respective elements are formed from common films at the same time. For this reason, the number of steps is small, and only simple steps are required. Therefore, a high yielding ratio can be achieved, and large-area, high-performance photoelectric conversion apparatuses can be manufactured. In addition, since a capacitor and a photoelectric conversion element can be formed within the same element, the number of elements can be substantially reduced to one-half. A further increase in yielding ratio can be attained.

According to the above photoelectric conversion apparatus, each photoelectric conversion element can detect the amount of incident light with only one injection inhibiting layer. Therefore, there is provided a low-cost photoelectric conversion apparatus which facilitates optimization of the manufacturing process, allows an increase in yielding ratio, can attain a decrease in manufacturing cost, and has a high S/N ratio. In addition, since neither a tunnel effect nor a Schottky barrier is used for the first electrode layer/insulating layer/photoelectric conversion semiconductor layer, the electrode material can be arbitrarily selected, and the degree of freedom in controlling the thickness of an insulating layer and the like is high.

Furthermore, switching elements such as a thin-film field effect transistor (TFT) or/and a capacitive element exhibit good matching and have the same film structure. For this reason, these elements can be formed as a common film at the same time. In addition, the important films of both a photoelectric conversion element and a TFT can be formed in the same vacuum, thereby realizing a photoelectric conversion apparatus having a higher S/N ratio at a lower cost. Furthermore, since each capacitor has an insulating layer as an intermediate layer, a high-performance photoelectric conversion apparatus capable of outputting the integral value of pieces of optical information obtained by a plurality of photoelectric conversion elements with a simple structure can be provided. A low-cost, large-area, high-performance facsimile apparatus and X-ray apparatus which have excellent characteristics can also be provided.

Figure 13:
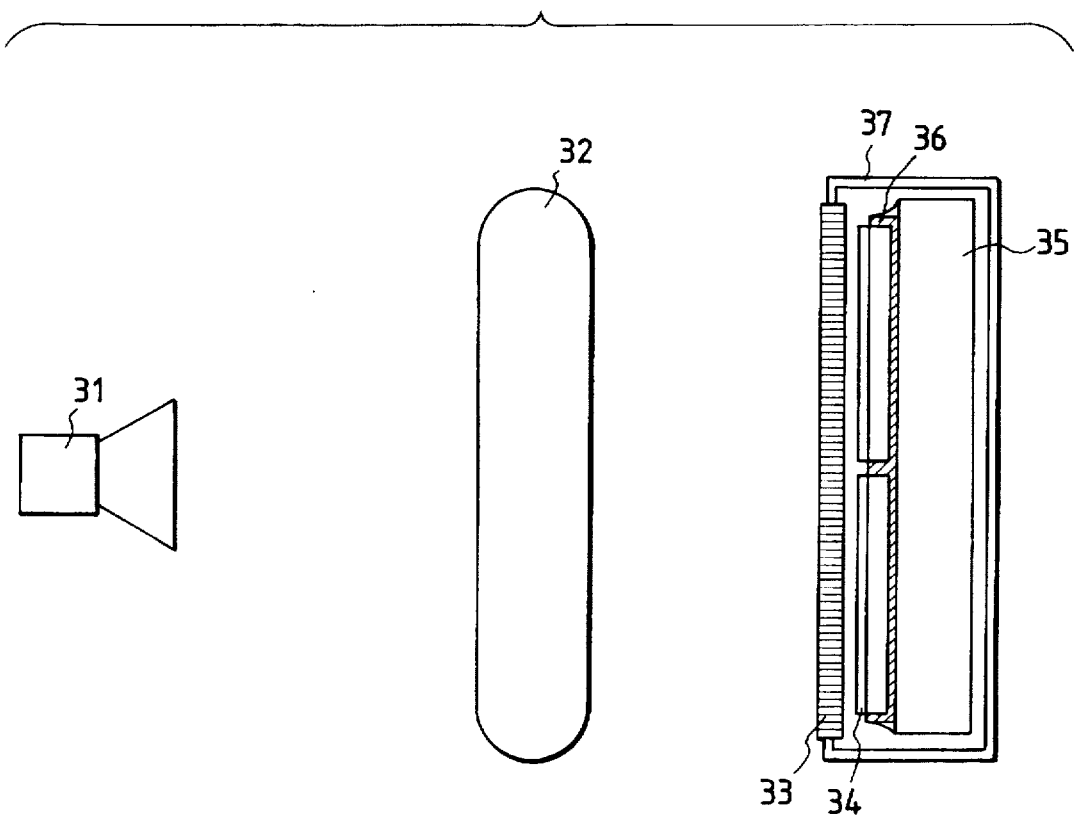
FIG. 13 is a schematic view showing an X-ray image pickup apparatus of the present invention.

FIG. 13 is a schematic view for explaining an embodiment of an X-ray image pickup apparatus including the above photoelectric conversion apparatus of the present invention, phosphors, and an X-ray source, and serving to convert X-rays transmitted through a human body or the like into an image signal using the photoelectric conversion apparatus.

This apparatus includes an X-ray source 31, an object 32, a grid 33 for removing scattered light from the object 32, phosphors 34, a base 35, and a photoelectric conversion apparatus 36 of the present invention.

X-rays emitted from the X-ray source 31 are irradiated on the object 32, and the transmitted X-rays are received by a sensor unit. Scattered light from the object 32 is removed by the grid.

The transmitted X-rays received by the sensor unit are absorbed by the phosphors and converted into visible light. The visible light is received as an image signal by the photoelectric conversion apparatus and processed by an external signal processing unit (not shown). In this case, with the photoelectric conversion apparatus of the present invention, light incident on the substrates of the photoelectric conversion apparatus was absorbed by the light-absorbing layer on the front and/or end faces of the substrates, thereby preventing a decrease in resolution and similar phenomena. As a result, an X-ray image with a high resolution could be obtained as compared with the case in which a conventional photoelectric conversion apparatus was used.

First Embodiment

Figure 14A:
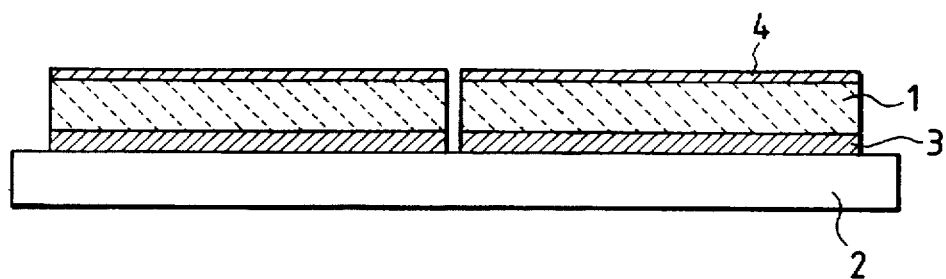
FIGS. 14A and 14B are views showing a photoelectric conversion apparatus according to still another embodiment of the present invention.

FIG. 14A is a view for explaining a photoelectric conversion apparatus according to the first embodiment of the present invention.

Figure 14B:
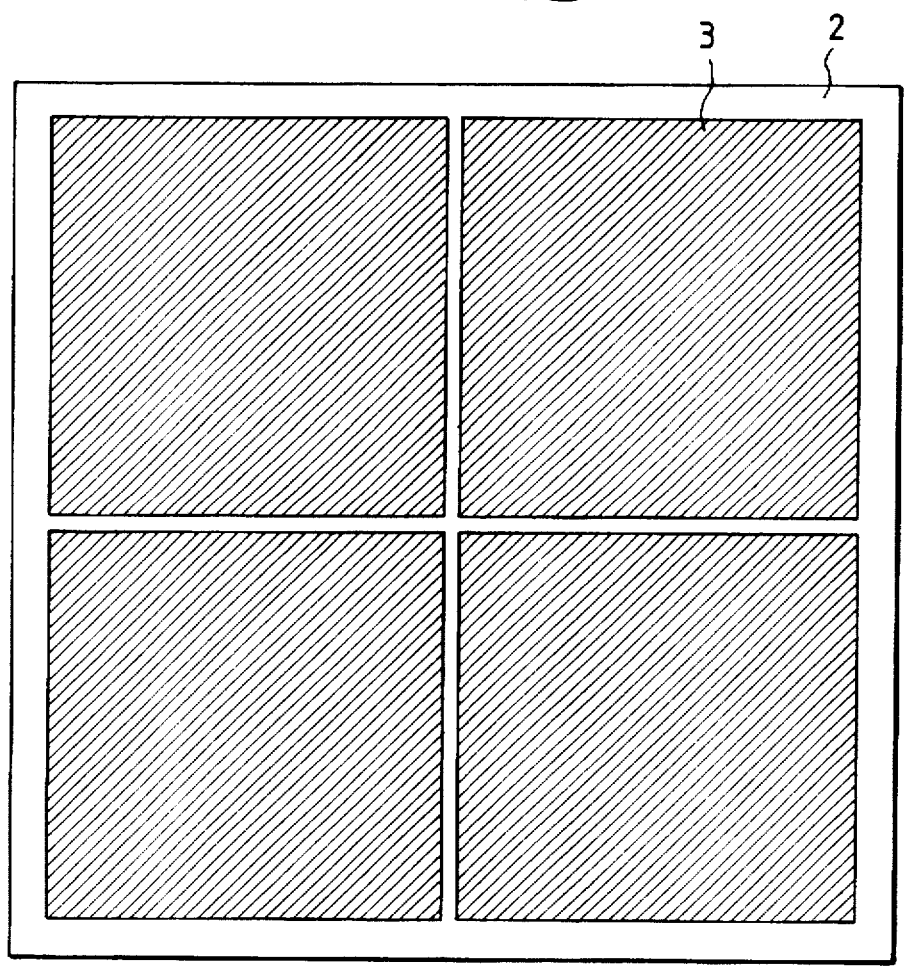

Glass substrates 1 on which photoelectric conversion elements 4 are mounted are bonded to a base 2 as follows. As shown in FIG. 14B, a black adhesive 3 is applied to the base 2 at positions (four positions) where the glass substrates 1 are to be bonded. As shown in FIG. 14A, the opposite surface of each glass substrate 1 to the surface on which photoelectric conversion elements 4 are formed is then placed on the adhesive 3.

In this embodiment, the black adhesive 3 serving as a light-absorbing layer is formed on only the lower surface of each substrate 1. This structure is effective when extraneous light incident from the end faces of the substrate 1 can be neglected.

Second Embodiment

Figure 15A:
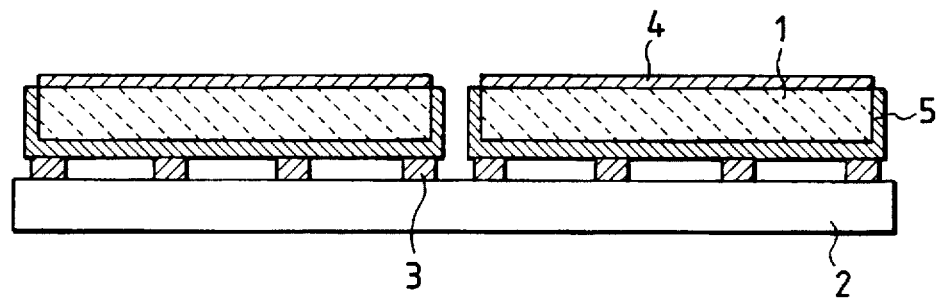
FIGS. 15A and 15B are views showing a photoelectric conversion apparatus according to still another embodiment of the present invention.

FIG. 15A is a view for explaining an apparatus according to the second embodiment of the present invention.

Figure 15B:
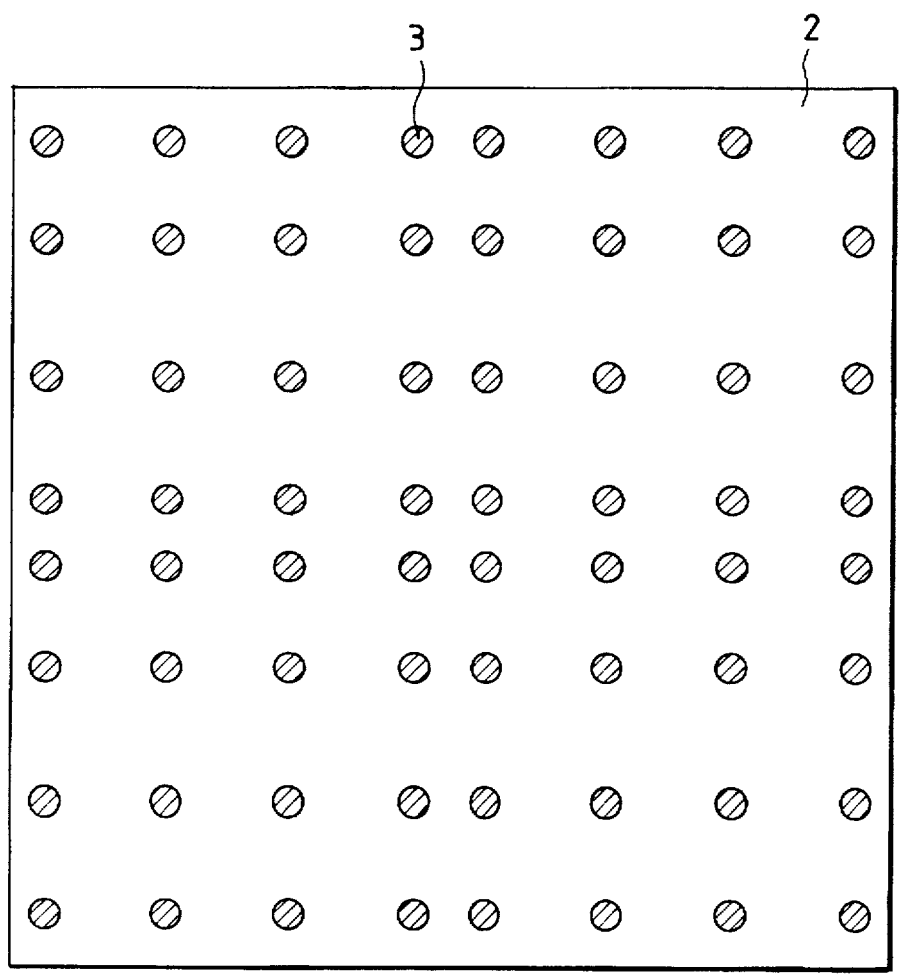

Glass substrates 1 on which photoelectric conversion elements 4 are mounted are bonded to a base 2 as follows. As shown in FIG. 15B, a dispenser is used to apply an adhesive 3 to the base 2 at positions where the glass substrates 1 are to be bonded. As shown in FIG. 15A, the opposite surface of each glass substrate 1 to the surface on which photoelectric conversion elements 4 are formed is then placed on the adhesive 3.

A light-absorbing layer 5 is formed on the front and side surfaces of each glass substrate I before it is bonded to the base 2.

Since the light-absorbing layer 5 is formed on the end faces of the substrate 1, this apparatus can prevent extraneous light from being incident on the end faces of the substrate 1.

Third Embodiment

Figure 16:
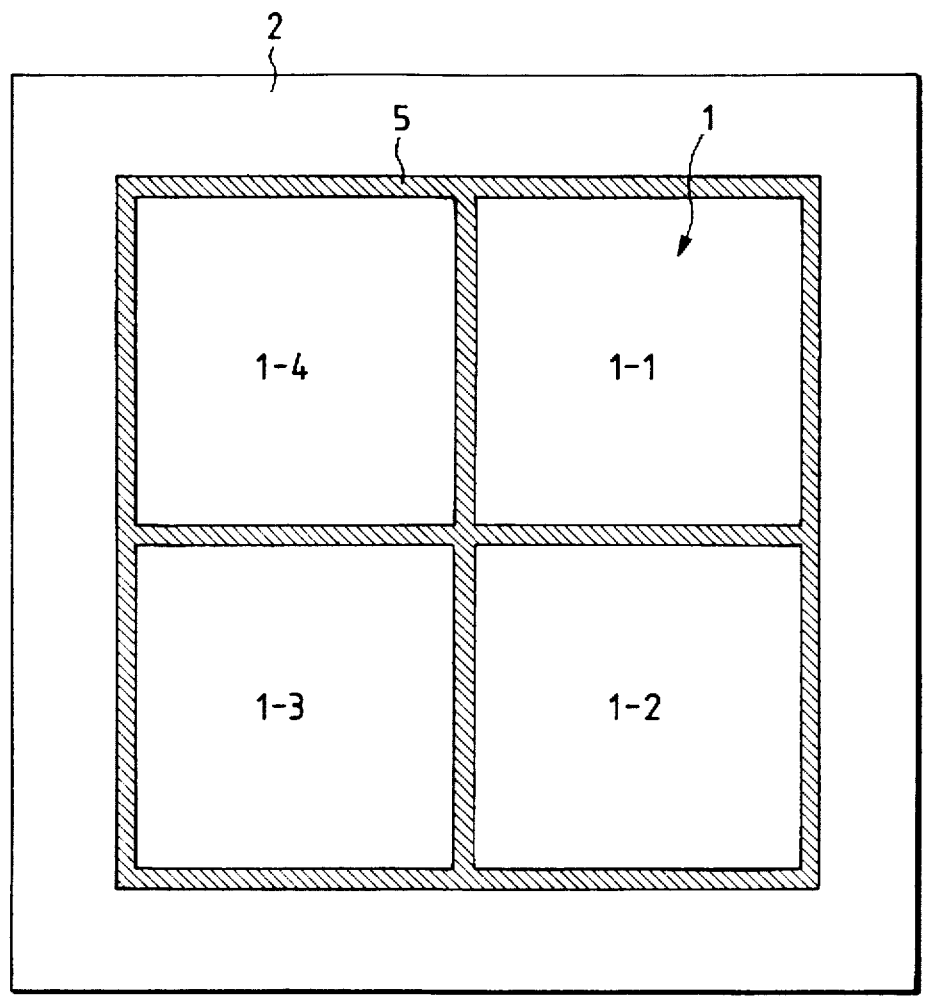
FIG. 16 is a plan view showing a photoelectric conversion apparatus according to still another embodiment of the present invention.
Figure 17:
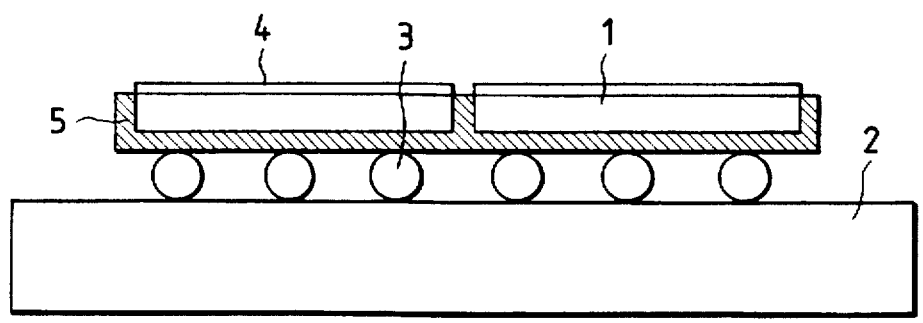
FIG. 17 is a sectional view of the photoelectric conversion apparatus in FIG. 16.

FIG. 16 is a plan view showing the overall structure of a photoelectric conversion apparatus according to the third embodiment of the present invention. FIG. 17 is a sectional view showing cross-sectional structure of the apparatus.

Referring to FIGS. 16 and 17, four substrates 1-1, 1-2, 1-3, and 1-4 on which photoelectric conversion elements are mounted are bonded to a base 2 to be spaced apart from each other, thereby obtaining a large photoelectric conversion apparatus.

A photoelectric conversion apparatus 1 is obtained by forming photoelectric conversion elements and thin-film field effect transistors, which are formed by using a photoelectric conversion semiconductor material typified by a-Si, on a substrate having a large area, and serves as a so-called contact type sensor for reading an information source through a one-to-one optical system. On this substrate, a plurality of elements are two-dimensionally arranged at equal intervals, and a photoelectric conversion semiconductor layer and a TFT semiconductor layer are formed at the same.

As shown in FIGS. 16 and 17, photoelectric conversion elements are formed on the four substrates, and the four substrates are bonded onto the base 2 with an adhesive 3 to be spaced apart from each other. A phosphor layer 4 is formed on the rear surface of each photoelectric conversion substrate. With this process, a large-area photoelectric conversion apparatus is obtained.

An antireflection film (light-absorbing layer) 5 for absorbing light components having wavelengths approximately equal to the wavelength of light emitted from the phosphor layer 4 so as not to reflect the light components, i.e., absorbing light having a predetermined wavelength to control the wavelength of light to be reflected, is formed on the front surfaces and end portions of the substrates and in the spaces between the substrates bonded to the base. With this structure, the optical characteristics, e.g., resolution, of the photoelectric conversion apparatus can be improved.

If, for example, the peak wavelength of light emitted from the phosphor layer is 540 nm, an antireflection film for absorbing only light components having wavelengths approximately equal to 540 nm so as not to reflect the light components is formed to improve the optical characteristics, e.g., resolution, of the photoelectric conversion apparatus.

Such an antireflection film can be formed by applying a polymer material such as an epoxy- or acrylic-based material by a transfer or printing method or with a brush.

As described above, according to this embodiment, in a photoelectric conversion apparatus with a large-area phosphor layer, in which a plurality of photoelectric conversion apparatus substrates, on which a plurality of elements are two-dimensionally arranged at equal intervals, and a photoelectric conversion semiconductor layer and a TFT semiconductor layer are formed at the same time, are bonded to a base to be spaced apart from each other, an antireflection film for absorbing light components having wavelengths approximately equal to the wavelength of light emitted from the phosphor layer so as not to reflect the light components is formed to prevent light emitted from the phosphor layer from being reflected irregularly by the front surfaces and end portions of the photoelectric conversion substrates except for the photoelectric conversion units, thereby preventing irregular reflection and improving the optical characteristics, e.g., resolution, of the photoelectric conversion apparatus.

Fourth Embodiment

Figure 18:
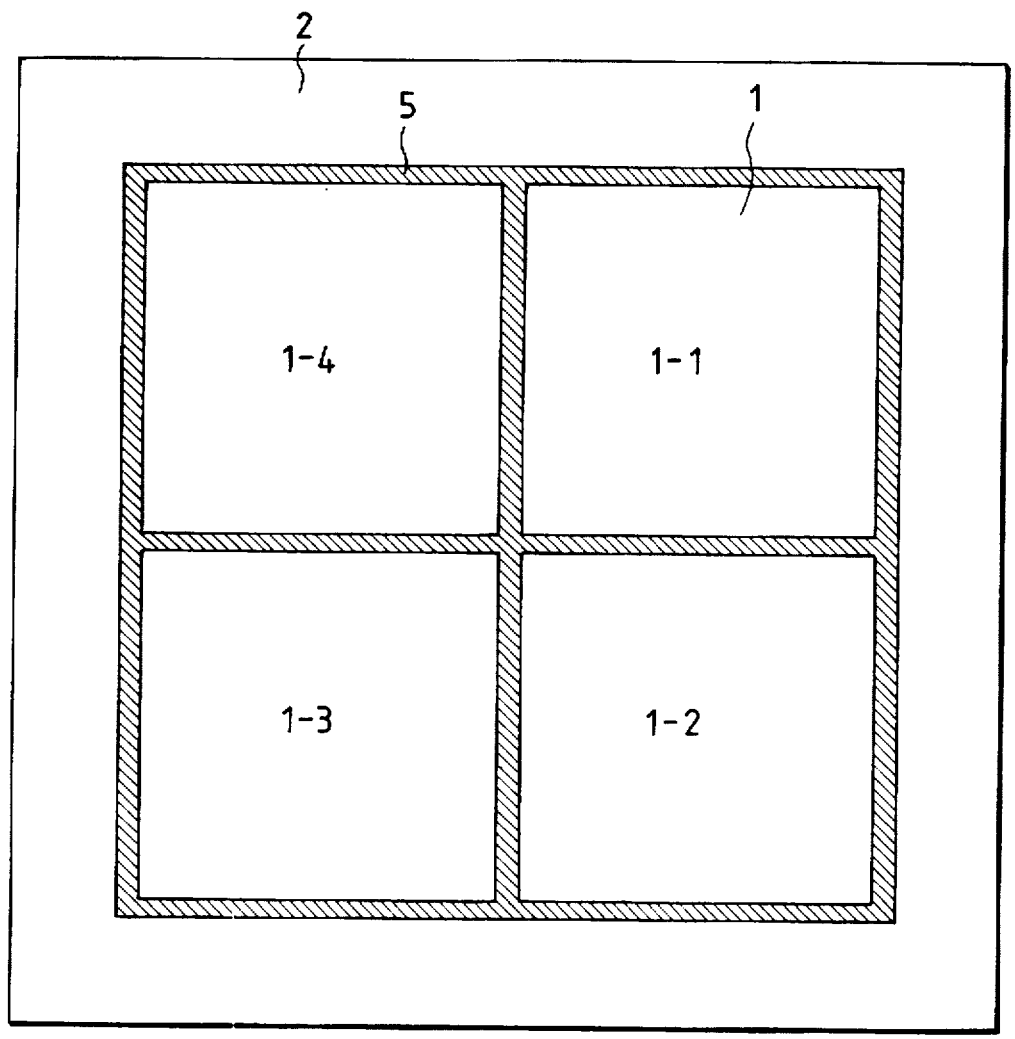
FIG. 18 is a plan view showing a photoelectric conversion apparatus according to still another embodiment of the present invention.
Figure 19:
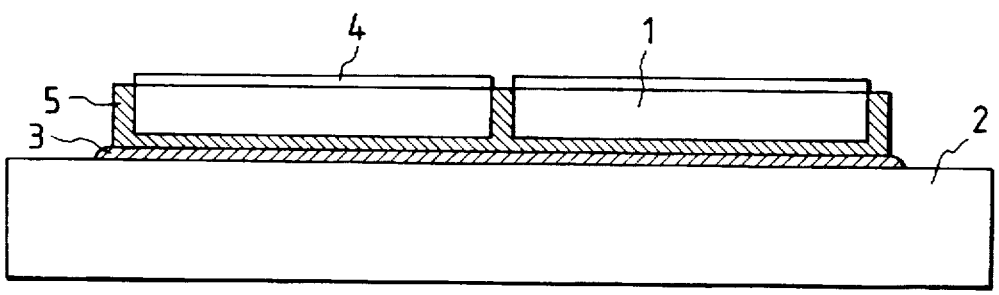
FIG. 19 is a sectional view of the photoelectric conversion apparatus in FIG. 18.

FIG. 18 is a schematic plan view for explaining a preferred embodiment of the photoelectric conversion apparatus of the present invention. FIG. 19 is a schematic sectional view showing the cross-sectional structure of the apparatus in FIG. 18.

Referring to FIGS. 18 and 19, this apparatus includes photoelectric conversion units 1, substrates 1-1, 1-2, 1-3, and 1-4 of the photoelectric conversion units, on each of which photoelectric conversion elements (not shown) are arranged in the form of a matrix, a base 2, an adhesive 3 for joining the photoelectric conversion units to the base 2, phosphor layers 4, and a light-absorbing layer 5.

Photoelectric conversion elements using an amorphous semiconductor material typified by amorphous silicon as a photoelectric conversion semiconductor layer are formed on the substrates 1-1, 1-2, 1-3, and 1-4 of the photoelectric conversion units 1. Thin-film field effect transistors used to output read signals from the photoelectric conversion units 1 to an external unit are preferably formed on the substrates 1-1, 1-2, 1-3, and 1-4. It is preferable that the plurality of photoelectric conversion elements be two-dimensionally arranged at equal intervals in combination with the thin-film field effect transistors.

As shown in FIG. 18, in the photoelectric conversion apparatus, the four photoelectric conversion units 1 are arranged in a 2×2 matrix in the vertical and horizontal directions and fixed to the base 2 with the adhesive 3. The photoelectric conversion units 1 need not always be fixed to the base 2 with the adhesive 3. However, the adhesive 3 is preferably used because the use of the adhesive 3 makes the photoelectric conversion units 1 less susceptible to undesired movement or shift after they are fixed. Note that the adhesive 3 need not be applied to all the positions between the base 2 and the photoelectric conversion units 1. The adhesive 3 can be applied in any manner as long as the photoelectric conversion units are permanently fixed to the base 2.

The phosphor layers 4 are preferably formed near the photoelectric conversion elements on the photoelectric conversion units. By forming these layers to be near or in contact with the photoelectric conversion elements, light from the phosphor layers, serving as information sources for emitting light to be received by the photoelectric conversion elements, can be read at 1× magnification.

The light-absorbing layer 5 for absorbing light emitted from the phosphor layers 4 is formed on the end faces and/or front surfaces of the substrates 1-1 to 1-4.

The formation of the light-absorbing layer 5 on the end faces of the substrates 1-1 to 1-4 prevents light entering the substrates and reflected by the front surfaces or light directly incident on the end faces from being reflected by the end faces and incident on the photoelectric conversion elements again, or decrease the amount of light incident thereon.

That is, the light-absorbing layer can suppress incidence of extraneous light on the photoelectric conversion elements near the end faces of the substrates 1-1 to 1-4 of the photoelectric conversion units, thereby increasing the S/N ratio.

The formation of the light-absorbing layer 5 on the front surfaces of the substrates 1-1 to 1-4 prevents light entering the substrates from being reflected by the front surfaces, or decreases the amount of light reflected.

Incidence of extraneous light on the photoelectric conversion elements can be suppressed by this function, and hence an increase in S/N ratio or substantial resolution can be attained.

The absorption wavelength characteristics of the light-absorbing layer in the present invention are set in accordance with the oscillation wavelength of the phosphor layer 4. More specifically, the light-absorbing layer is designed to absorb a light component having the same wavelength as the main peak wavelength of the oscillation wavelengths of the phosphor layer 4, or absorb light components having wavelength near the peak oscillation wavelength as needed. In general, the light-absorbing layer is designed to have a color complementary to the color of light emitted from the phosphor layer 4.

In addition, the color of the light-absorbing layer is preferably set as follows. First of all, the main peak wavelength of the oscillation wavelengths of the phosphor layer 4 is located on the chromaticity diagram. A straight line is drawn to pass through a white point W indicating white on the chromaticity diagram. A light-absorbing member is then designed to absorb light of a color appearing on the straight line ahead of the point W. A light-absorbing member which transmits light components of a complementary wavelength pair is more preferably used depending on the oscillation wavelength of the phosphor layer 4.

If, for example, the main peak wavelength of the oscillation wavelengths of light emitted from the phosphor layer 4 is 540 mm, a light-absorbing member for absorbing light components having wavelengths approximately equal to 540 mm, including a light component having a wavelength equal to 540 mm, is preferably used. More specifically, a light-absorbing member for absorbing red, blue or magenta light is preferably used.

As a coloring material for coloring a light-absorbing member, a material which does not easily decompose upon irradiation of X-rays and exhibits long-term stability is preferably used.

A spin coating method, a curtain coating method, a screen printing method, a transfer method such as offset printing, or a coating method using a dispenser is preferably used to apply a light-absorbing member to the end faces or front surfaces of the substrates. Alternatively, a light-absorbing member may be applied in the following manner. A resin serving as a light-absorbing member is applied to a base plate by the spin coating method, the curtain coating method, the screen printing method, the transfer method, or the method using a dispenser. Thereafter, photoelectric conversion units are arranged on the base plate. As a result, the light-absorbing member is applied to the front surfaces or end portions of the substrates of the photoelectric conversion units. If the resin layer applied to the base plate has a sufficient thickness, the resin flows between the substrates when the photoelectric conversion units are pressed against the base plate. As a result, the light-absorbing member can be applied to the end portions of the substrates. When the photoelectric conversion units are removed from the base plate, the light-absorbing member is applied to the front surfaces and end faces of the substrates.

In this case, if the base plate is used as a base, and a mixture of an adhesive and the above coloring material is used as a resin, the resin layer can be commonly used as a light-absorbing layer and an adhesive.

Figure 20:
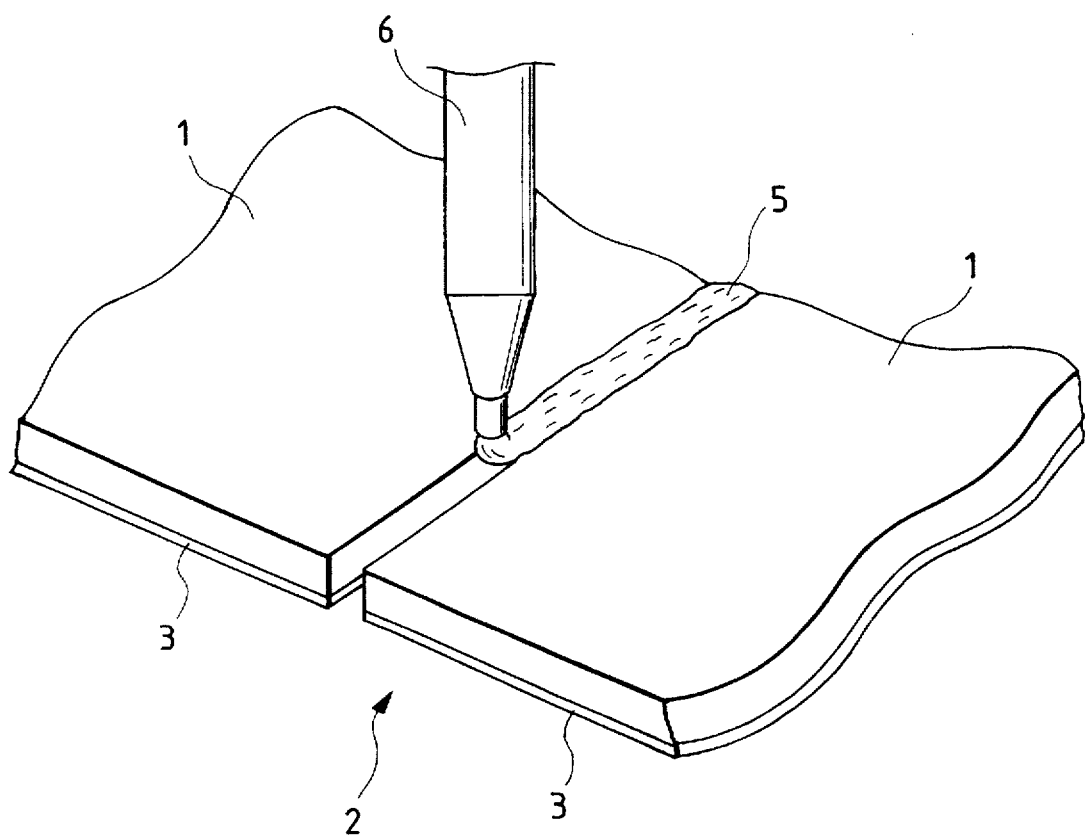
FIG. 20 is a view showing a step in a method of manufacturing a photoelectric conversion apparatus of the present invention.

When a light-absorbing member is to be applied to only the end faces of the substrates, a dispenser may be used to inject a resin serving as a light-absorbing member into the spaces between the substrates, as shown in the schematic perspective view of FIG. 20, after photoelectric conversion units are fixed on a base.

Fifth Embodiment

Figure 21:
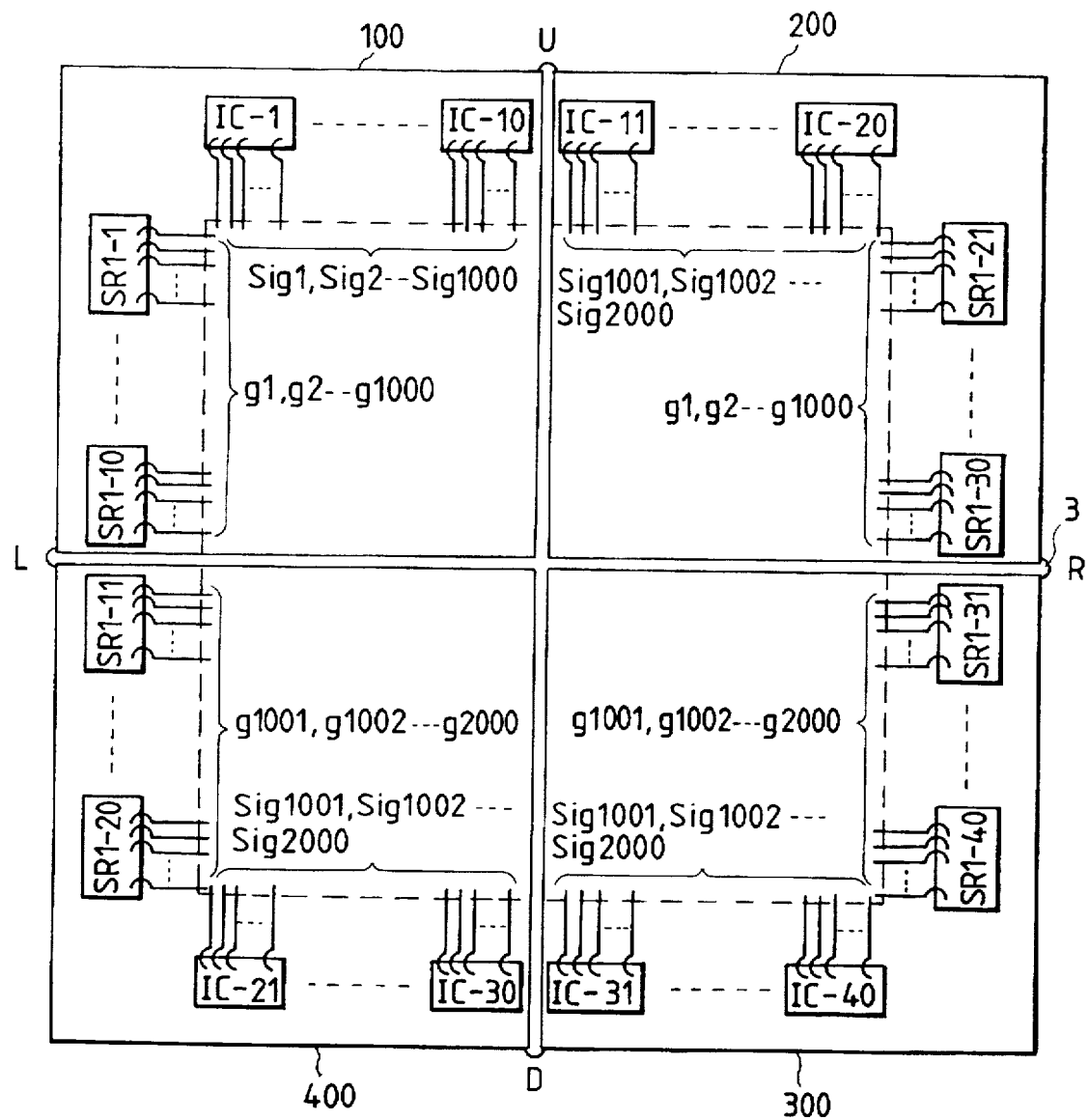
FIG. 21 is a plan view showing a photoelectric conversion apparatus according to still another embodiment of the present invention.

FIG. 21 is a plan view showing the overall structure of a photoelectric conversion apparatus according to the fifth embodiment of the present invention.

The photoelectric conversion apparatus in FIG. 21 is characterized in that photoelectric conversion devices 100, 200, 300, and 400 formed on four substrates are bonded to be spaced apart from each other by a space corresponding to one photoelectric conversion element so as to constitute one large photoelectric conversion apparatus.

On the photoelectric conversion device 100, 1,000×1,000 photoelectric conversion elements are arranged and connected to control lines g1 to g1000 and signal lines sig1 to sig1000 i.e., a total of 2,000 lines. Each 100 shift registers SR1 are integrated into one chip. A total of 10 shift register chips SR1-1 to SRI-10 are arranged on a substrate 100 and connected to the control lines g1 to g1000.

Each 100 detection integrated circuits are also integrated into one chip. A total of 10 integrated circuit chips IC1 to IC10 are arranged on the substrate 100 and connected to the signal lines sig1 to sig1000. The photoelectric conversion devices 200, 300, and 400 each have the same structure as that of the substrate 100. That is, 100×100 photoelectric conversion elements are arranged on each substrate and connected to 1,000 control lines and 1,000 signal lines. In addition, 10 shift register chips and 10 detection integrated circuit chips are arranged on each substrate. These shift register chips and detection integrated circuit ships on the respective substrates may be identical to each other or different from each other. Furthermore, the four photoelectric conversion devices may be scanned simultaneously. In this case, the scanning time can be shortened to ¼.

As shown in FIG. 21, photoelectric conversion elements are formed on four substrates, and the four photoelectric conversion device substrates are bonded to be slightly spaced apart from each other, thereby forming a large-area photoelectric conversion apparatus. With this process, the yielding ratio per substrate increases, and at the same time, the amount of money lost per substrate due to a defect can be reduced. More specifically, if the area on which the photoelectric conversion elements in the large-area photoelectric conversion apparatus shown in FIG. 21 is equal to the area on which photoelectric conversion elements in a photoelectric conversion apparatus formed on one large-area substrate, the total length of all the control and signal lines within the respective substrates in FIG. 21 is about ¼ the total length of all the control and signal lines in the photoelectric conversion apparatus formed on one large-area substrate.

In such a photoelectric conversion apparatus, when control and signal lines undergo short circuits or open circuits, all output signals from the photoelectric conversion elements connected to these lines become inaccurate. For this reason, the photoelectric conversion apparatus cannot be used. The above failures occur almost in proportion to the total length of all the control and signal lines, thus decreasing the yielding ratio.

The yielding ratio based on wiring failures per substrate of the apparatus in FIG. 21 is about four times higher than that of a photoelectric conversion apparatus in which many photoelectric conversion elements are formed on one large-area substrate. In addition, since the amount of money lost when an apparatus cannot be used owing to one defective substrate in FIG. 21 is almost proportional to the area of a substrate, the amount of money lost in the case of the apparatus shown in FIG. 21 is almost ¼ that in the case of the photoelectric conversion apparatus in which all photoelectric conversion elements are formed on one large-area substrate.

If the space between substrates is set to be a value corresponding to 1.5 pixels or less of photoelectric conversion elements as shown in FIG. 21, the average value of output signals from adjacent photoelectric conversion elements can be used as data from the portion between the elements where no photoelectric conversion element is formed. For this reason, a simple data correction method can be used, and at the same time, relatively accurate data can be obtained.

Figure 22:
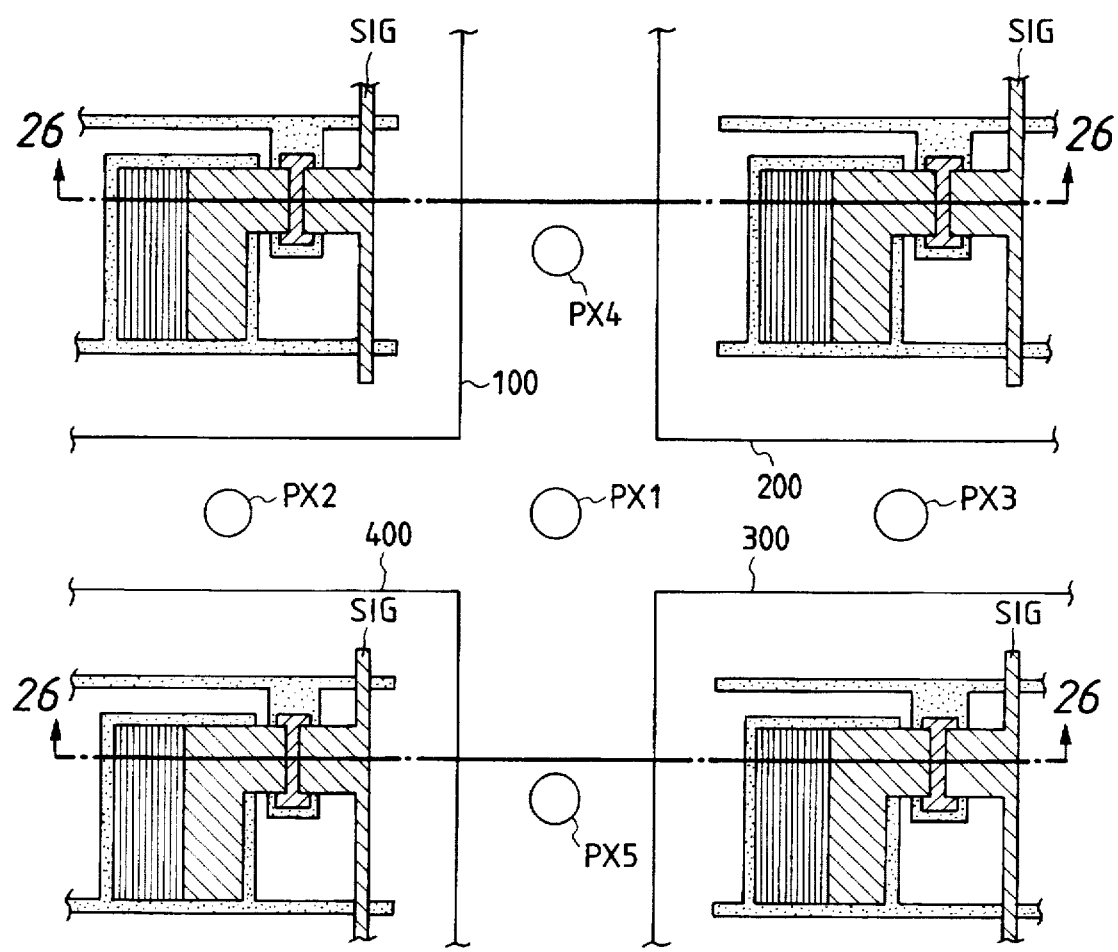
FIG. 22 is a view showing a photoelectric conversion apparatus of the present invention.

FIG. 22 is an enlarged value of a central portion in FIG. 21.

FIG. 22 shows the central portion where the four substrates are bonded. A method of actually correcting data from an element which should be present in the central portion and using the resultant data will be described below.

Data from the central element in FIG. 22 cannot be interpolated by using data from the adjacent (right and left) elements. Similarly, data from the upper and lower elements cannot be used either.

Data at a position px4 and data at a position px5 in FIG. 22 can be obtained by using the average values of data from the respective adjacent elements. Data at a position px1 can be interpolated by using the average value of the data at the positions px4 and px5. Similarly, data at positions px2 and px3 can be interpolated by averaging data from the respective upper and lower elements.

In general, data is interpolated by various methods, in addition to the method of using the average value of data from the right and left elements or from the upper and lower elements. For example, the following methods are known: a method of using the average value of data from a total of eight elements, i.e., upper, lower, right, left, obliquely upper right, obliquely upper left, obliquely lower right, and obliquely lower left elements; a method of using some data of the above eight data; and a method of using the geometric mean of the above data.

A series of operations for such data interpolation will be described with reference to the flow chart of FIG. 23. This series of operations can be expressed by the following flow chart: 2-dimensional image input step STP1→memory storage step STP2→image processing (interpolation) step STP3→memory storage step STP4→2-dimensional image output step STP5.

Figure 24:
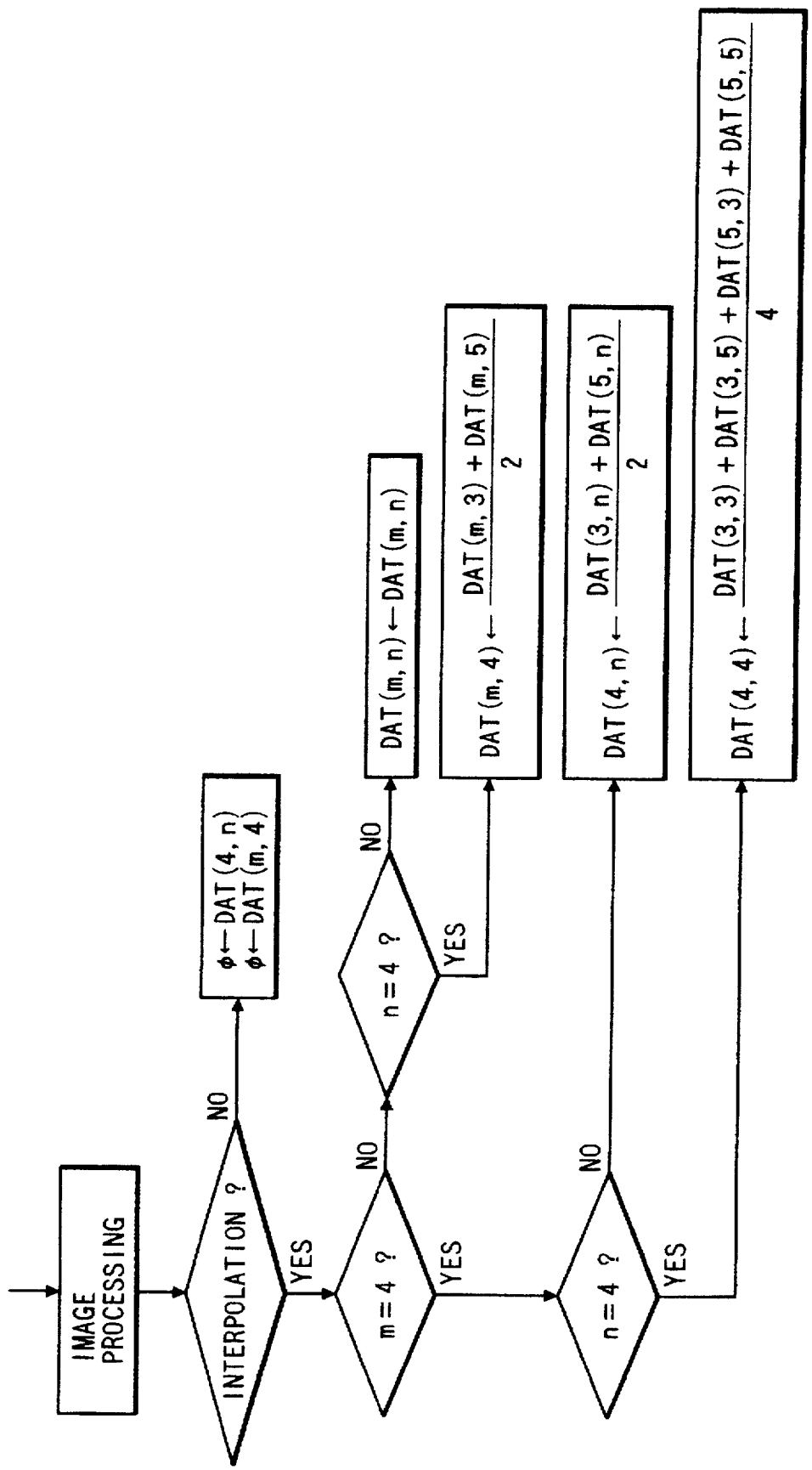
FIG. 24 is a flow chart showing a signal processing method used in the present invention.

An embodiment of this method will be described in detail next with reference to FIG. 24 showing a flow chart for image processing (interpolation) and FIG. 25 schematically showing the arrangement of data on the substrates of a photoelectric conversion apparatus.

Assume that 3 (vertical)×3 (horizontal) photoelectric conversion elements are formed on each of substrates 110, 210, 310, and 410, and the respective substrates are spaced apart from each other by a space corresponding to one photoelectric conversion element. In this case, the number of data required is (3+1+3)×(3+1+3)=49. As shown in FIG. 25, the respective data will be referred to as DAT (1, 1), DAT (1, 2), . . . , DAT (1, 7), DAT (2, 1)), . . . , DAT (7, 7).

Figure 23:
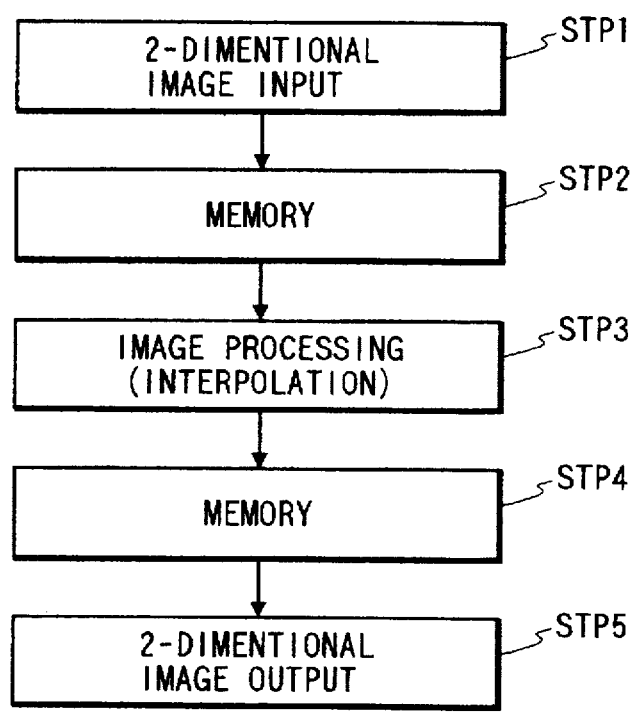
FIG. 23 is a flow chart showing a signal processing method used in the present invention.

In step STP2 in the flow chart of FIG. 23, data from each photoelectric conversion element is input to the memory. In this case, since there are no data generated at DAT (m, 4) and DAT (4, n), empty states (ϕ) are set.

The image processing (interpolation) in FIG. 24 will be described next.

First of all, it is determined whether to interpolate data between the respective substrates. If there is no need to interpolate the data, the data are kept in the empty states (ϕ). If interpolation is required, it is checked whether the current data is data to be interpolated. In this case, if m≠4 or n≠4, the data is not data to be interpolated. In this case, the data obtained from the photoelectric conversion element and input to the memory is used. Assume the data is data to be interpolated. In this case, if m=4, the average value of the data at the upper and lower positions with respect to the data to be interpolated is input, as data to be interpolated, to the memory again. If n=4, the average value of the data at the right and left positions with respect to the data to be interpolated is input, as data to be interpolated, to the memory again (step STP4 in FIG. 23). In this case, if m=4 and n=4, i.e., the current data is DAT (4, 4) in the center of the four substrates, since there no data at the upper, lower, right, and left positions in the memory, the average value of the four data at the upper right, upper left, lower right, and lower left positions is input to the memory.

In this manner, by using the average value of data at right, left, upper, and lower positions with respect to necessary data, interpolation can be easily performed.

Figure 26:
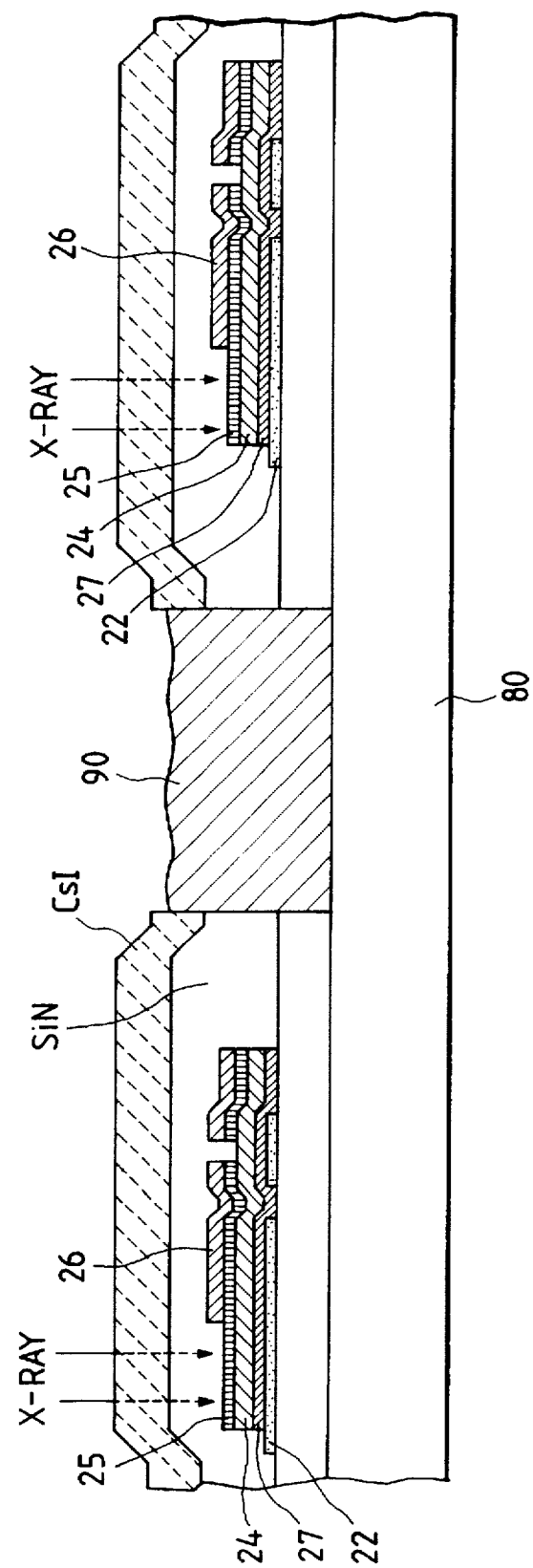
FIG. 26 is a sectional view showing an X-ray detection photoelectric conversion apparatus of the present invention.

FIG. 26 is a sectional view taken along a line 26—26 in FIG. 22. Referring to FIG. 26, four substrates are bonded to one large glass substrate 80 or copper plate 80. The spaces between the four substrates are filled with a black resin 90 serving as a light-absorbing member to prevent crosstalk due to scattering of light from phosphors.

As shown in FIGS. 9A and 9B, each of the photoelectric conversion apparatuses of the first to fifth embodiments comprises:

a photoelectric conversion element formed by stacking a first electrode layer 2, an insulating layer 7, a photoelectric conversion semiconductor layer 4, a semiconductor layer 5 for inhibiting injection of carriers of a first conductivity type, and a second electrode layer;

a photoelectric conversion means for applying an electric field to the photoelectric conversion element in a direction in which carriers of the first conductivity type generated by signal light incident on the photoelectric conversion semiconductor layer are held therein, and carriers of a second conductivity type different from the first conductivity type are guided toward the second electrode layer;

a refresh means for applying an electric field to the photoelectric conversion element in a direction in which the carriers of the first conductivity type are guided from the photoelectric conversion semiconductor layer to the second electrode layer; and a signal detection unit for detecting the carriers of the first conductivity type which are stored in the photoelectric conversion semiconductor layer or the carriers of the second conductivity type which are guided to the second layer during a photoelectric conversion operation performed by the photoelectric conversion means.

Sixth Embodiment

Figure 27:
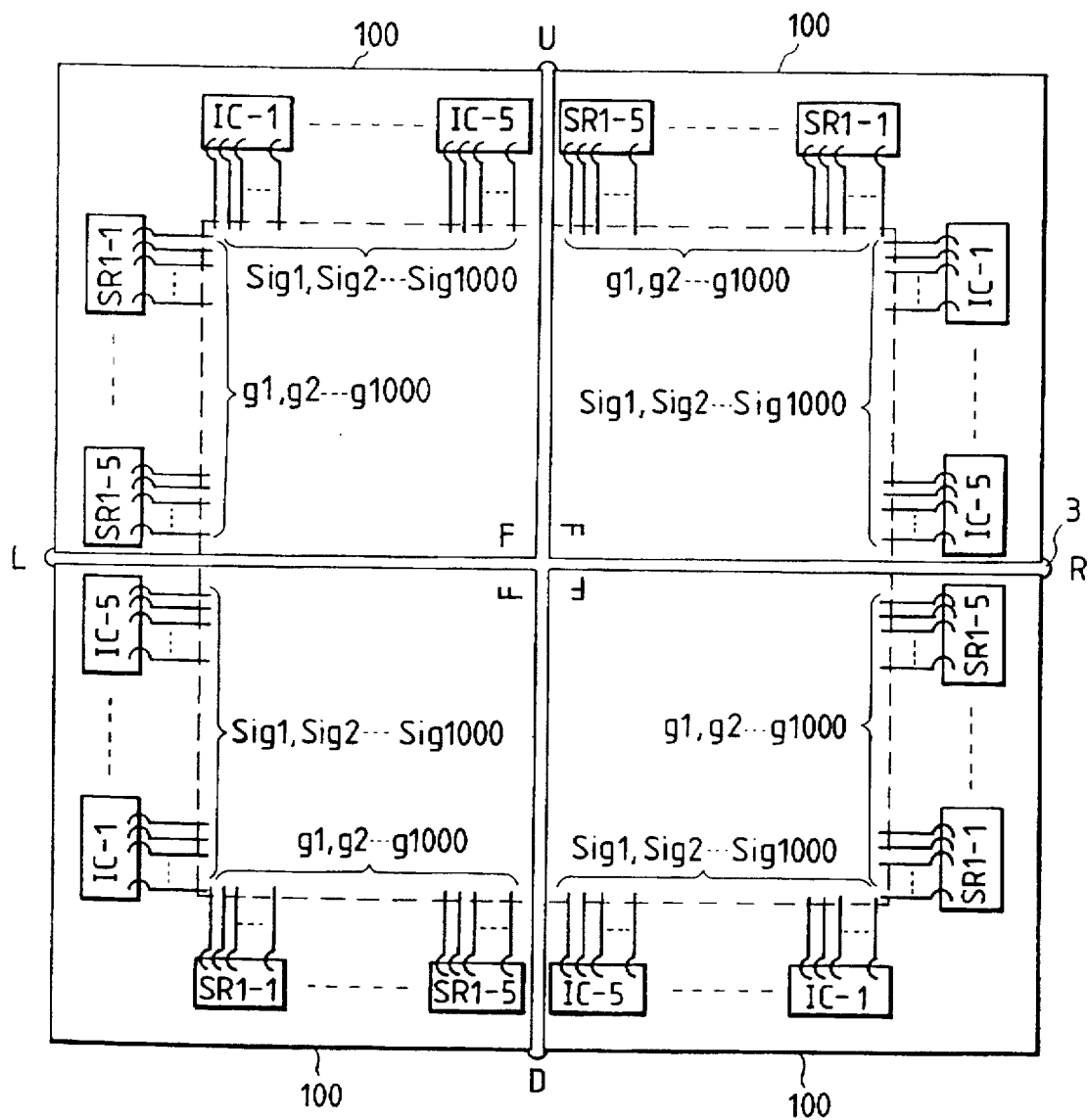
FIG. 27 is a plan view showing a photoelectric conversion apparatus according to still another embodiment of the present invention.

FIG. 27 is a plan view showing the overall structure of a photoelectric conversion apparatus according to the sixth embodiment of the present invention.

The photoelectric conversion apparatus shown in FIG. 27 is characterized in that four photoelectric conversion devices each have the same structure as that of a photoelectric conversion device 100, each of the four photoelectric conversion devices is rotated through 900° within the same plane, and the four devices are bonded to be spared apart from each other by a space corresponding to one pixel of a photoelectric conversion element so as to form one large photoelectric conversion apparatus.

On the photoelectric conversion device 100, 1,000×1,000 photoelectric conversion elements are arranged and connected to control lines g1 to g1000 and signal lines sig1 to sig1000, i.e., a total of 2,000 lines. Each 100 shift registers SR1 are integrated into one chip. A total of 10 shift register chips SR1-1 to SR1-10 are arranged on a substrate 100 and connected to the control lines g1 to g1000.

Each 100 detection integrated circuits are integrated into one chip. A total of 10 integrated circuit chips IC1 to IC10 are arranged on the substrate 100 and connected to the signal lines sig1 to sig1000. These shift register chips and detection integrated circuit ships on the respective substrates may be identical to each other. Furthermore, the four photoelectric conversion devices may be simultaneously scanned. In this case, the scanning time can be shortened to ¼.

As shown in FIG. 27, photoelectric conversion elements and lines having the same pattern are formed on four substrates, identical shift registers and identical detection integrated circuits are mounted on the four substrates, each of the four substrates is rotated through 90°, and the substrates are bonded to be slightly spaced apart from each other, thereby forming a large-area photoelectric conversion apparatus. With this structure, the number of parts can be greatly decreased. In addition, the inspection step can be performed by using one type of apparatus. As a result, the inspection step can be efficiently performed, and hence an increase on throughput can be attained.

Although not shown, another large-area photoelectric conversion apparatus may be formed on the basis of the same concept as that for the photoelectric conversion apparatus shown in FIG. 27 in the following manner. Two sets of photoelectric conversion elements and lines having the same pattern are formed on each of four substrates, each of the two substrates is rotated through 180°, and the substrates are bonded to be spaced apart from each other, thereby forming a large-area photoelectric conversion apparatus. With this structure, the number of parts can be reduced, and the inspection step can be performed by using two types of apparatuses. The inspection step can be efficiently performed, and hence an increase on throughput can be attained. In addition, the cost of a large-area photoelectric conversion apparatus can be reduced.

If shift registers and detection integrated circuits mounted on four substrates are designed to be driven in two directions, all the four photoelectric conversion devices can be scanned in the same direction. As a result, the circuit for processing signal read by all the photoelectric conversion elements can be simplified, allowing high-speed signal processing.

A large-area photoelectric conversion apparatus can therefore be manufactured at a low cost.

In each of the photoelectric conversion apparatuses of the fifth and sixth embodiments, a light-absorbing member is preferably applied to at least the front surface or end faces of each substrate 100.

In addition, as shown in FIG. 26, phosphors may be formed on the photoelectric conversion elements to form an X-ray image pickup apparatus.

As has been described above, according to the present invention, the yielding ratio per substrate can be increased in manufacturing a large-area photoelectric conversion apparatus, and the amount of money lost per substrate due to a defect can be reduced, thereby effectively reducing the cost of a large-area photoelectric conversion apparatus.

In addition, according to this embodiment, by setting the space between bonded substrates to be a value corresponding to 1.5 pixels of photoelectric conversion elements, data at each portion where no photoelectric conversion element is formed is minimized, thereby facilitating data interpolation at each portion where no photoelectric conversion element is formed, and obtaining relatively accurate data.

Furthermore, according to this embodiment, the inspection step can be efficiently improved in manufacturing a large-area photoelectric conversion apparatus, and hence an increase in throughput and a decrease in the number of parts can be attained. As a result, the cost of a large-area photoelectric conversion apparatus can be further reduced.

Moreover, according to this embodiment, in a large-area photoelectric conversion apparatus, all the photoelectric conversion element are scanned in the same direction, and signal processing can be performed by a simple device at a high speed. As a result, a reduction in the cost of the photoelectric conversion apparatus and an improvement in performance can be attained.

What is claimed is:

1. A photoelectric conversion apparatus comprising:
   (a) a plurality of transparent substrates, each said transparent substrate having a plurality of photoelectric conversion elements on a front surface thereof;
   (b) a base member for supporting said transparent substrates on a front surface thereof; and
   (c) a light-absorbing member disposed between a rear surface of each said transparent substrate and said front surface of said base member, and on end faces of each of said transparent substrates.

2. An apparatus according to claim 1, wherein said light-absorbing member consists of a material capable of absorbing light which degrades characteristics of said photoelectric conversion element when the light is incident thereon.

3. An apparatus according to claim 1, wherein said light-absorbing member is a black material or a material mainly having a color complementary to a color of light to be received by said photoelectric conversion element.

4. An apparatus according to claim 1, wherein said light-absorbing member is a resin.

5. An apparatus according to claim 1, wherein said light-absorbing member is an inorganic material.

6. An apparatus according to claim 1, wherein said light-absorbing member is a metal oxide.

7. An apparatus according to claim 1, wherein said light-absorbing member is a resin colored with a dye or pigment.

8. An apparatus according to claim 1, wherein said light-absorbing member is a resin selected from the group consisting of an epoxy resin, an acrylic resin, and a silicone resin.

9. An apparatus according to claim 1, wherein said light-absorbing member has an adhesive function.

10. An apparatus according to claim 1, wherein said light-absorbing member is placed in a space between said substrates.

11. An apparatus according to claim 1, wherein the space between said substrates is smaller than a value corresponding to 1.5 pixels of said photoelectric conversion elements.

12. An apparatus according to claim 1, further comprising a light converter.

13. An apparatus according to claim 12, wherein said light converter is a phosphor.

14. An apparatus according to claim 12, wherein said light converter is a layer common to all said substrates.

15. An apparatus according to claim 12, wherein said light converter is provided for each of said substrates.

16. An apparatus according to claim 1, wherein said base is a transparent base.

17. An apparatus according to claim 1, wherein said base has an area larger than a sum of areas of said plurality of substrates.

18. An apparatus according to claim 1, wherein said light-absorbing layer is a metal oxide formed by a sputtering method.

19. An apparatus according to claim 1, wherein said light-absorbing layer is a black resin applied by a print method and a coating method.

20. An apparatus according to claim 1, further comprising means for interpolating data at a portion in the space where no photoelectric conversion element is formed by using output signals from right and left photoelectric conversion elements.

21. An apparatus according to claim 1, wherein a total of four substrates having the same structure as said substrate are two-dimensionally arranged in a 2×2 matrix in the vertical and horizontal directions, and are bonded while each of said substrates is rotated through 90°.

22. An apparatus according to claim 1, wherein a total of four substrates, each having photoelectric conversion elements two-dimensionally mounted thereon, are two-dimensionally bonded in a 2×2 matrix in the vertical and horizontal directions, and two substrates of said four bonded substrates which are not adjacent to each other have the same structure, are rotated through 180° on a plane with respect to each other, said four substrates being scanned in the same direction.

23. An apparatus according to claim 1, wherein said substrate has:

a photoelectric conversion element formed by stacking a first electrode layer, an insulating layer, a photoelectric conversion semiconductor layer, a semiconductor layer for inhibiting injection of carriers of a first conductivity type, and a second electrode layer;

photoelectric conversion means for applying an electric field to said photoelectric conversion element in a direction in which carriers of the first conductivity type generated by signal light incident on the photoelectric conversion semiconductor layer are held therein, and carriers of a second conductivity type different from the first conductivity type are guided toward the second electrode layer;

refresh means for applying an electric field to said photoelectric conversion element in a direction in which the carriers of the first conductivity type are guided from the photoelectric conversion semiconductor layer to the second electrode layer; and a signal detection unit for detecting the carriers of the first conductivity type which are stored in the photoelectric conversion semiconductor layer or the carriers of the second conductivity type which are guided to the second layer during a photoelectric conversion operation performed by said photoelectric conversion means.

24. An X-ray image pickup apparatus comprising:

(a) photoelectric conversion means including (i) a plurality of transparent substrates, each said transparent substrate having a plurality of photoelectric conversion elements on a front surface thereof; (ii) a base member for supporting said transparent substrates on a front surface thereof; and (iii) a light absorbing member disposed between a rear surface of each said transparent substrate and said front surface of said base member, and on end faces of each of said transparent substrates;

(b) X-ray irradiation means for irradiating X-rays; and (c) a light converter for receiving X-rays and generating light having a different wavelength.

25. An apparatus according to claim 24, wherein said light-absorbing member consists of a material capable of absorbing light which degrades characteristics of said photoelectric conversion element when the light is incident thereon.

26. An apparatus according to claim 24, wherein said light-absorbing member is a blank material or a material mainly having a color complementary to a color of light to be received by said photoelectric conversion element.

27. An apparatus according to claim 24, wherein said light-absorbing member is a resin.

28. An apparatus according to claim 24, wherein said light-absorbing member is an inorganic material.

29. An apparatus according to claim 24, wherein said light-absorbing member is a metal oxide.

30. An apparatus according to claim 24, wherein said light-absorbing member is a resin colored with a dye or pigment.

31. An apparatus according to claim 24, wherein said light-absorbing member is a resin selected from the group consisting of an epoxy resin, an acrylic resin, and a silicone resin.

32. An apparatus according to claim 24, wherein said light-absorbing member has an adhesive function.

33. An apparatus according to claim 24, wherein said light-absorbing member is placed in a space between said substrates.

34. An apparatus according to claim 24, wherein the space between said substrates is smaller than a value corresponding to 1.5 pixels of said photoelectric conversion elements.

35. An apparatus according to claim 24, wherein said light converter is a phosphor.

36. An apparatus according to claim 24, wherein said light converter is a layer common to all said substrates.

37. An apparatus according to claim 24, wherein said light converter is provided for each of said substrates.

38. An apparatus according to claim 24, wherein said base is a transparent base.

39. An apparatus according to claim 24, wherein said base has an area larger than a sum of areas of said plurality of substrates.

40. An apparatus according to claim 24, wherein said light-absorbing layer is a metal oxide formed by a sputtering method.

41. An apparatus according to claim 24, wherein said light-absorbing layer is a black resin applied by a print method and a coating method.

42. An apparatus according to claim 24, further comprising means for interpolating data at a portion in the space where no photoelectric conversion element is formed by using output signals from right and left photoelectric conversion elements.

43. An apparatus according to claim 24, wherein a total of four substrates having the same structure as said substrate are two-dimensionally arranged in a 2×2 matrix in the vertical and horizontal directions, and are bonded while each of said substrates is rotated through 90°.

44. An apparatus according to claim 24, wherein a total of four substrates, each having photoelectric conversion elements two-dimensionally mounted thereon, are two-dimensionally bonded in a 2×2 matrix in the vertical and horizontal directions, and two substrates of said four bonded substrates which are not adjacent to each other have the same structure, are rotated through 180° on a plane with respect to each other, said four substrates being scanned in the same direction.

45. An apparatus according to claim 24, wherein said substrate has:

a photoelectric conversion element formed by stacking a first electrode layer, an insulating layer, a photoelectric conversion semiconductor layer, a semiconductor layer for inhibiting injection of carriers of a first conductivity type, and a second electrode layer;

photoelectric conversion means for applying an electric field to said photoelectric conversion element in a direction in which carriers of the first conductivity type generated by signal light incident on the photoelectric conversion semiconductor layer are held therein, and carriers of a second conductivity type different from the first conductivity type are guided toward the second electrode layer;

refresh means for applying an electric field to said photoelectric conversion element in a direction in which the carriers of the first conductivity type are guided from the photoelectric conversion semiconductor layer to the second electrode layer; and a signal detection unit for detecting the carriers of the first conductivity type which are stored in the photoelectric conversion semiconductor layer or the carriers of the second conductivity type which are guided to the second layer during a photoelectric conversion operation performed by said photoelectric conversion means.

46. A photoelectric conversion apparatus comprising:

(a) a transparent substrate having a plurality of photoelectric conversion elements on a front surface thereof;

(b) a base member for supporting said transparent substrate on a front surface thereof; and (c) a light-absorbing member disposed between a rear surface of said transparent substrate and said front surface of said base member, and on end faces of said transparent substrate.

47. An apparatus according to claim 46, wherein a light converter for receiving X-rays is disposed over said photoelectric conversion elements.

48. A photoelectric conversion apparatus comprising:

(a) a transparent substrate having a plurality of photoelectric conversion elements on a front surface thereof;

(b) a base member for supporting said transparent substrate on a front surface thereof; and (c) a light-absorbing member disposed between a rear surface of said transparent substrate and said front surface of said base member.

49. An apparatus according to claim 48, wherein light converter for receiving X-rays is disposed over said photoelectric conversion elements.

* * * * *